US012665568B2

(12) United States Patent
Paul et al.

(10) Patent No.: US 12,665,568 B2
(45) Date of Patent: Jun. 23, 2026

(54) MONOLITHIC-INTEGRATED BULK ACOUSTIC WAVE (BAW) RESONATOR

(71) Applicant: QUALCOMM Incorporated, San Diego, CA (US)

(72) Inventors: Abhijeet Paul, Escondido, CA (US); Jonghae Kim, San Diego, CA (US); Mishel Matloubian, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 440 days.

(21) Appl. No.: 18/189,779

(22) Filed: Mar. 24, 2023

(65) Prior Publication Data

US 2024/0322791 A1 Sep. 26, 2024

(51) Int. Cl.
 *H03H 9/17* (2006.01)
 *H03H 3/02* (2006.01)

(52) U.S. Cl.
 CPC .............. *H03H 9/173* (2013.01); *H03H 3/02* (2013.01); *H03H 2003/021* (2013.01)

(58) Field of Classification Search
 CPC ...................................................... H03H 9/173
 See application file for complete search history.

(56) References Cited

U.S. PATENT DOCUMENTS

2006/0202779 A1 9/2006 Fazzio et al.
2017/0264263 A1 9/2017 Huang et al.

2021/0119595 A1* 4/2021 Turner ............... H03H 9/02015
2021/0167752 A1* 6/2021 Caron .................... H03H 9/205
2021/0398957 A1* 12/2021 Lan .......................... H10D 1/68
2021/0399716 A1 12/2021 Yu et al.
2023/0084598 A1* 3/2023 Weng ................. H03H 9/02031
310/365
2023/0261626 A1* 8/2023 McHugh ............... H03H 9/568
333/192

OTHER PUBLICATIONS

International Search Report and Written Opinion—PCT/US2024/015547—ISA/EPO—Oct. 2, 2024.
Partial International Search Report—PCT/US2024/015547—ISA/EPO—Jul. 1, 2024.

* cited by examiner

*Primary Examiner* — Samuel S Outten
(74) *Attorney, Agent, or Firm* — Muncy Grissler, Olds & Lowe, P.C

(57) ABSTRACT

Disclosed are techniques for an integrated circuit (IC) that includes one or more transistors on a substrate and an interconnection structure on the one or more transistors. The interconnection structure includes a semiconductor structure embedded in the interconnection structure. In an aspect, the semiconductor structure includes a cavity structure, a piezoelectric layer over the cavity structure, an upper conductive structure on the piezoelectric layer, and a first contact structure on the upper conductive structure. In an aspect, the cavity structure includes a bottom that is a part of a first etch stop layer over a substrate, a top that is a part of a second etch stop layer over the first etch stop layer, one or more sidewalls connecting the bottom and the top of the cavity structure, and a cavity between the top and the bottom of the cavity structure and surrounded by the one or more sidewalls.

18 Claims, 20 Drawing Sheets

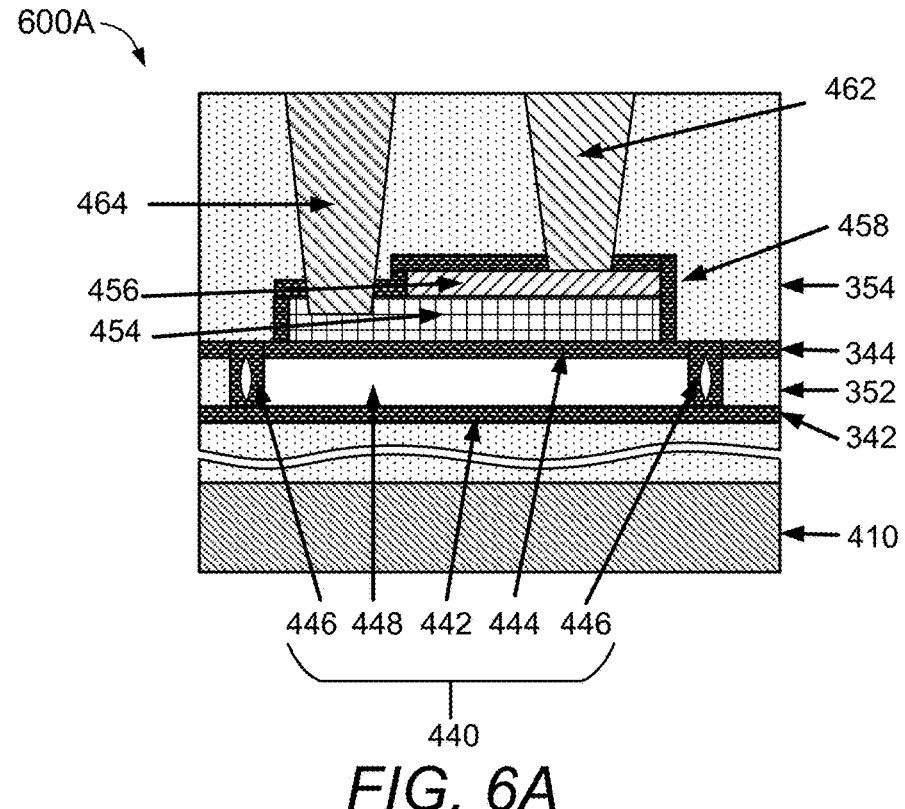
FIG. 6A
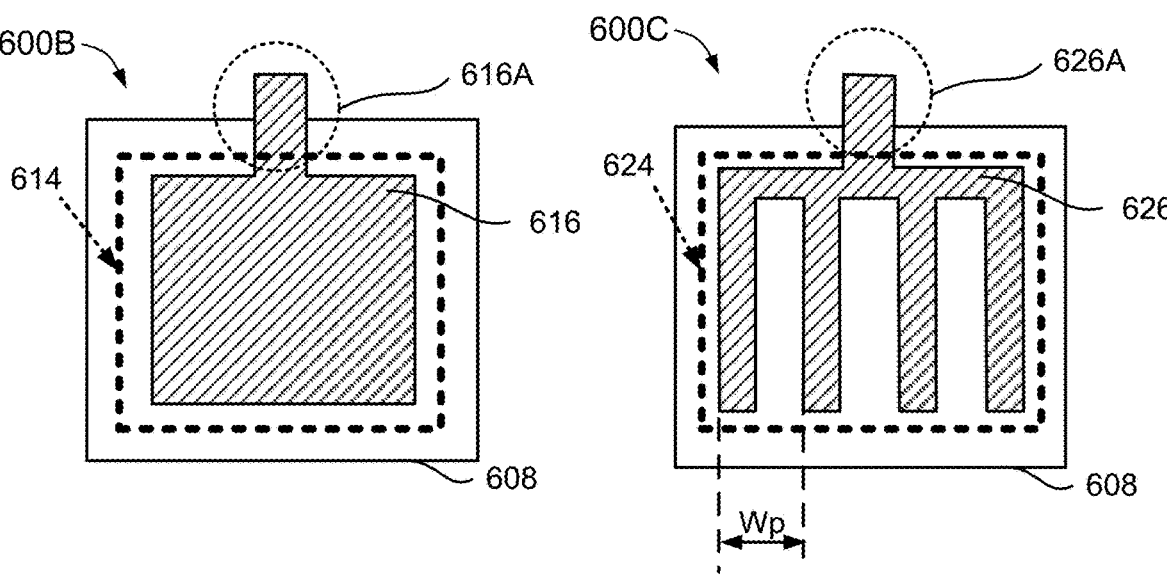
FIG. 6B                    FIG. 6C

710

760

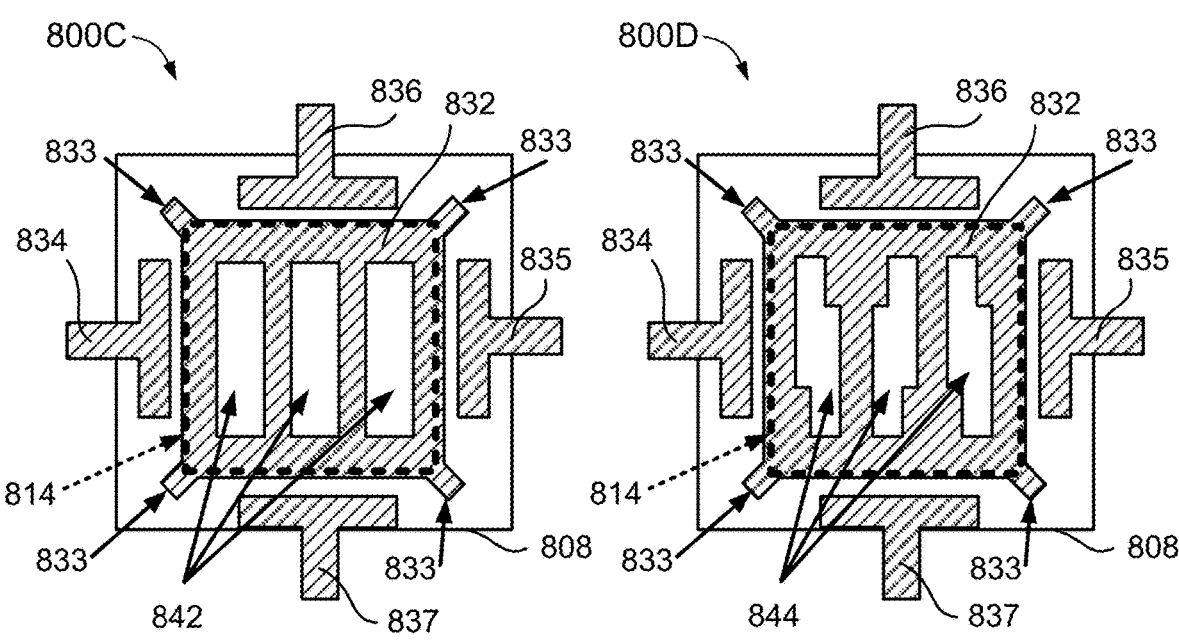
*FIG. 8C*        *FIG. 8D*
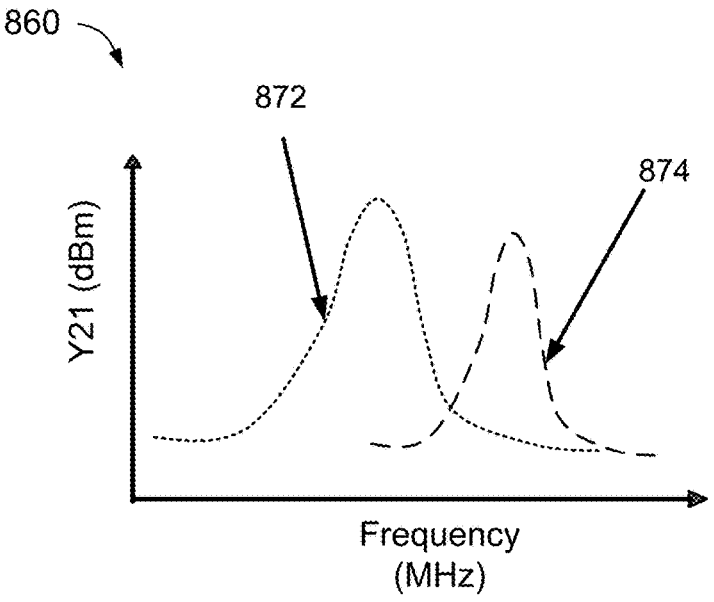
*FIG. 8E*

1000

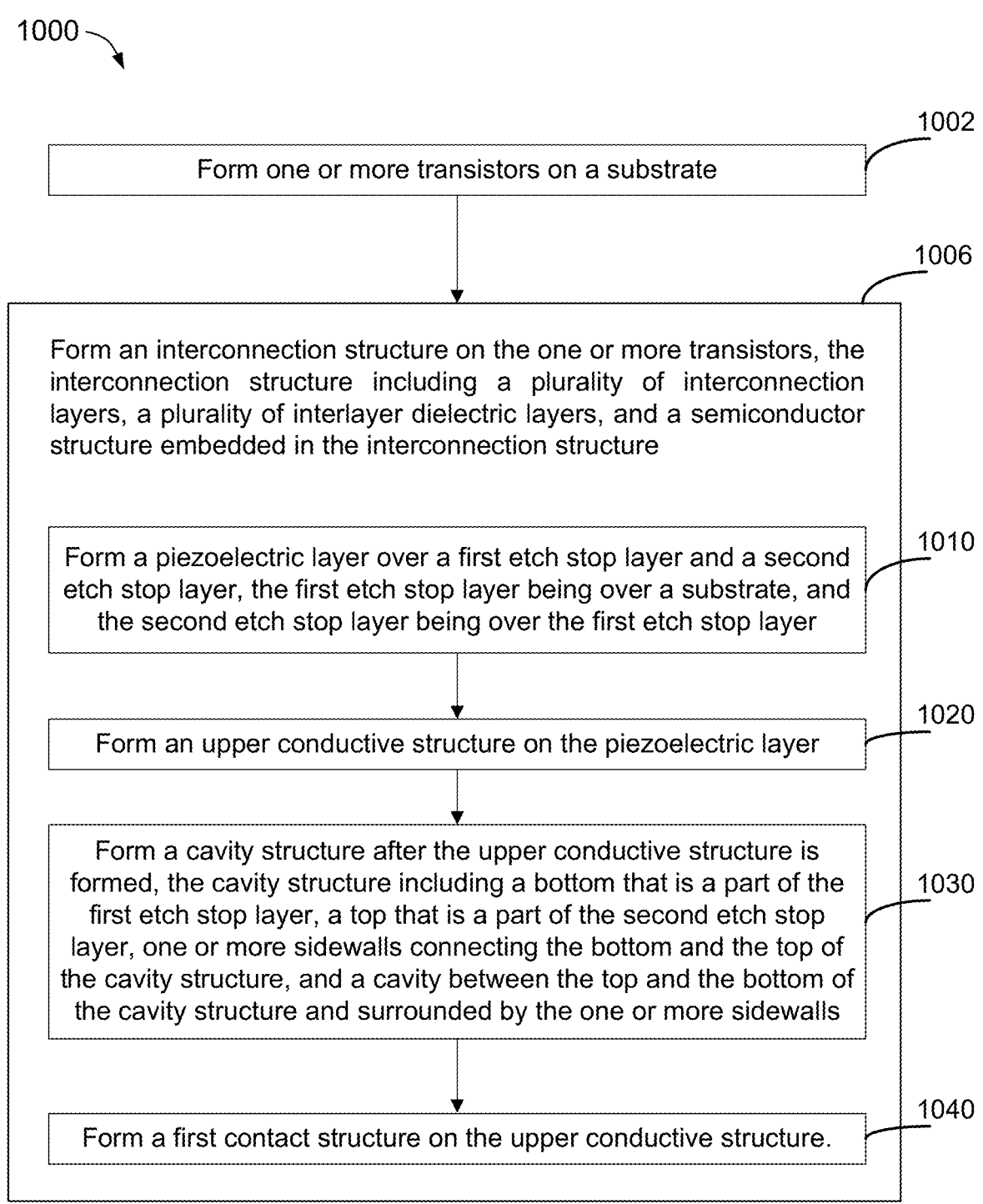

1002
Form one or more transistors on a substrate

1006
Form an interconnection structure on the one or more transistors, the interconnection structure including a plurality of interconnection layers, a plurality of interlayer dielectric layers, and a semiconductor structure embedded in the interconnection structure 1010
Form a piezoelectric layer over a first etch stop layer and a second etch stop layer, the first etch stop layer being over a substrate, and the second etch stop layer being over the first etch stop layer 1020
Form an upper conductive structure on the piezoelectric layer 1030
Form a cavity structure after the upper conductive structure is formed, the cavity structure including a bottom that is a part of the first etch stop layer, a top that is a part of the second etch stop layer, one or more sidewalls connecting the bottom and the top of the cavity structure, and a cavity between the top and the bottom of the cavity structure and surrounded by the one or more sidewalls 1040
Form a first contact structure on the upper conductive structure.

MONOLITHIC-INTEGRATED BULK ACOUSTIC WAVE (BAW) RESONATOR

TECHNICAL FIELD

The present disclosure generally relates to semiconductor structures, and more particularly, to a semiconductor structure that includes a monolithic-integrated bulk acoustic wave (BAW) resonator.

BACKGROUND

Integrated circuits (ICs) are becoming more prevalent in electronic devices. An IC may be implemented in the form of an IC die (or an IC chip, or simply a die or a chip) that has a set of electronic circuits integrated thereon. In some applications, an IC may be configured to form a filter or an oscillator based on a resonator for the operations of the IC.

FIG. 1A is a simplified circuit diagram illustrating an oscillator 100, according to related art of the disclosure. The oscillator 100 includes an input terminal 102, an output terminal 104, an amplifier 110, and a resonator 120. The amplifier 110 has a transconductance gm. The input of the amplifier 110 is coupled to the input terminal 102, and the output of the amplifier 110 is coupled to the output terminal 104. The resonator 120 has a resonating frequency fr and coupled between the input terminal 102 and the output terminal 104. The amplifier 110 and the resonator 120 may form a positively feedback configuration.

FIG. 1B is a simplified diagram 150 illustrating a spectrum of a signal at the output terminal 104 of the oscillator 100 depicted in FIG. 1A, according to related art of the disclosure. The horizontal axis of the diagram 150 represents frequency, and the vertical axis of the diagram 150 represents signal strength in decibel-milliwatts (dBm). As shown in FIG. 1B, a majority of frequency component of the signal at the output terminal 104 may be at the resonating frequency fr of the resonator 120. The efficacy of the oscillator 100 for outputting a signal at the frequency fr may be measurable by a quality factor (Q factor). In general, the higher the Q factor is, the more energy of the frequency component at the frequency fr in the signal at the output terminal 104 would be. However, the Q factor of an oscillator (or a filter) may depend on not only the Q factor of the resonator but also the degradation caused by various passive devices used to form the oscillator or the filter and the parasitic effects (e.g., parasitic resistance, parasitic inductance, and/or parasitic capacitance) of the conductive paths connecting the resonator to other portions of the oscillator or the filter.

Therefore, there is a need for an improved resonator and an improved manufacturing method for forming the resonator that may reduce the degradation of the Q factor of the resulting oscillator or filter.

SUMMARY

The following presents a simplified summary relating to one or more aspects disclosed herein. Thus, the following summary should not be considered an extensive overview relating to all contemplated aspects, nor should the following summary be considered to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In an aspect, an integrated circuit (IC) includes one or more transistors on a substrate; and an interconnection structure on the one or more transistors, the interconnection structure including a plurality of interconnection layers, a plurality of interlayer dielectric layers, and a semiconductor structure embedded in the interconnection structure, wherein the semiconductor structure comprises: a cavity structure that includes: a bottom that is a part of a first etch stop layer; a top that is a part of a second etch stop layer over the first etch stop layer; one or more sidewalls connecting the bottom and the top of the cavity structure; and a cavity between the top and the bottom of the cavity structure and surrounded by the one or more sidewalls; a piezoelectric layer over the cavity structure; an upper conductive structure on the piezoelectric layer; and a first contact structure on the upper conductive structure.

In an aspect, a method of manufacturing an integrated circuit (IC) includes forming one or more transistors on a substrate; and forming an interconnection structure on the one or more transistors, the interconnection structure including a plurality of interconnection layers, a plurality of interlayer dielectric layers, and a semiconductor structure embedded in the interconnection structure, the forming the interconnection structure comprising: forming a piezoelectric layer over a first etch stop layer and a second etch stop layer, the first etch stop layer being over the substrate, and the second etch stop layer being over the first etch stop layer; forming an upper conductive structure on the piezoelectric layer; forming a cavity structure after the upper conductive structure is formed, the cavity structure including: a bottom that is a part of the first etch stop layer; a top that is a part of the second etch stop layer; one or more sidewalls connecting the bottom and the top of the cavity structure; and a cavity between the top and the bottom of the cavity structure and surrounded by the one or more sidewalls; and forming a first contact structure on the upper conductive structure.

Other objects and advantages associated with the aspects disclosed herein will be apparent to those skilled in the art based on the accompanying drawings and detailed description.

BRIEF DESCRIPTION OF THE DRAWINGS

The accompanying drawings are presented to aid in the description of various aspects of the disclosure and are provided solely for illustration of the aspects and not limitation thereof.

FIG. 6A is a cross-sectional view of a semiconductor structure showing an example BAW resonator of an IC chip, according to aspects of the disclosure.

FIGS. 6B-6C are top views illustrating example layouts of a cavity of a cavity structure, a piezoelectric layer, and an upper conductive structure of a resonator, according to aspects of the disclosure.

FIGS. 8B-8D are top views illustrating example layouts of a cavity of a cavity structure, a piezoelectric layer, and an upper conductive structure of a resonator, according to aspects of the disclosure.

FIG. 8E is a diagram illustrating the frequency responses of example resonators based on the layouts of FIGS. 8C and 8D, according to aspects of the disclosure.

FIG. 10 illustrates a method for manufacturing an IC that includes a semiconductor structure, according to aspects of the disclosure.

DETAILED DESCRIPTION

Figure 1A:
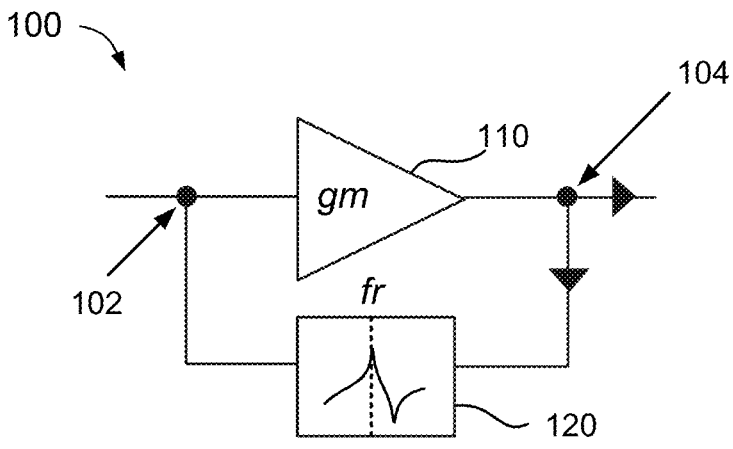
FIG. 1A is a simplified circuit diagram illustrating an oscillator, according to related art of the disclosure.
Figure 1B:
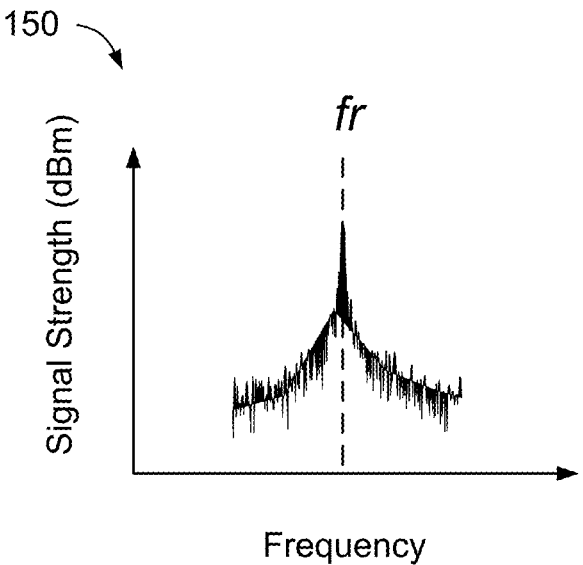
FIG. 1B is a simplified diagram illustrating a spectrum of a signal at the output terminal of the oscillator depicted in FIG. 1A, according to related art of the disclosure.

Aspects of the disclosure are provided in the following description and related drawings directed to various examples provided for illustration purposes. Alternate aspects may be devised without departing from the scope of the disclosure. Additionally, well-known elements of the disclosure will not be described in detail or will be omitted so as not to obscure the relevant details of the disclosure.

The words "exemplary" and/or "example" are used herein to mean "serving as an example, instance, or illustration." Any aspect described herein as "exemplary" and/or "example" is not necessarily to be construed as preferred or advantageous over other aspects. Likewise, the term "aspects of the disclosure" does not require that all aspects of the disclosure include the discussed feature, advantage or mode of operation.

Those of skill in the art will appreciate that the information and signals described below may be represented using any of a variety of different technologies and techniques. For example, data, instructions, commands, information, signals, bits, symbols, and chips that may be referenced throughout the description below may be represented by voltages, currents, electromagnetic waves, magnetic fields or particles, optical fields or particles, or any combination thereof, depending in part on the particular application, in part on the desired design, in part on the corresponding technology, etc.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, the sequence(s) of actions described herein can be considered to be embodied entirely within any form of non-transitory computer-readable storage medium having stored therein a corresponding set of computer instructions that, upon execution, would cause or instruct an associated processor of a device to perform the functionality described herein. Thus, the various aspects of the disclosure may be embodied in a number of different forms, all of which have been contemplated to be within the scope of the claimed subject matter. In addition, for each of the aspects described herein, the corresponding form of any such aspects may be described herein as, for example, "logic configured to" perform the described action.

In some configurations, an oscillator or a filter may be used for operations of an IC. In some configurations, a resonator for an oscillator may be a crystal-based resonator (e.g., a quartz crystal resonator) or a micro electro-mechanical system (MEMS)-based resonator (e.g., a surface acoustic wave (SAW) resonator or a bulk acoustic wave (BAW) resonator).

In some configurations, the crystal-based resonators may be expansive and may require extremely precision dimensions of the crystal. In some configurations, the crystal-based resonators may be very prone to mechanical shocks and thus may not be used for many applications.

In some configurations, while many IC chips may be manufactured based on a complementary metal-oxide-semiconductor (CMOS)-based manufacturing process, most of the MEMS-based resonators may be manufactured based on a manufacturing flow that is not fully compatible with the CMOS-based manufacturing process. Therefore, in many applications, the MEMS components (e.g., the MEMS-based resonators) are typically not in the same IC chip with other CMOS counterparts. For example, while the amplifier of the oscillator or the filter may be embedded in the IC chip, the resonator for forming the oscillator or the filter may be disposed outside the IC chip.

Figure 2A:
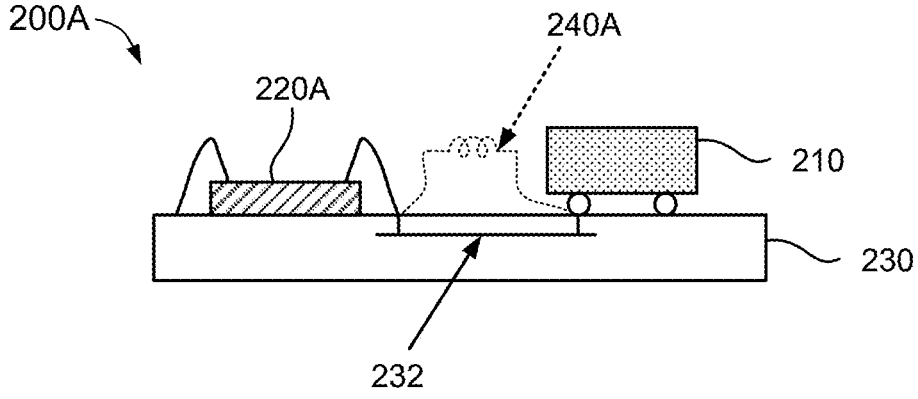
FIGS. 2A-2B illustrate example circuit modules, according to aspects of the disclosure.

FIG. 2A illustrates an example circuit module 200A, according to aspects of the disclosure. As shown in FIG. 2A, the circuit module 200A may include an IC chip 210 and a resonator 220A mounted on a package substrate 230. The package substrate 230 may include an embedded conductive line 232. The IC chip 210 may be electrically coupled with the conductive line 232 through bumps (not labeled), and the resonator 220A may be electrically coupled with the conductive line 232 through bond wires (not labeled). In some aspects, the resonator 220A and some electrical devices in the IC chip 210 may form an oscillator or a filter for operations of the IC chip 210. The bond wires, the conductive line 232, and the bumps may effectively introduce a parasitic device 240A (e.g., introducing parasitic inductance) between the IC chip 210 and the resonator 220A.

Figure 2B:
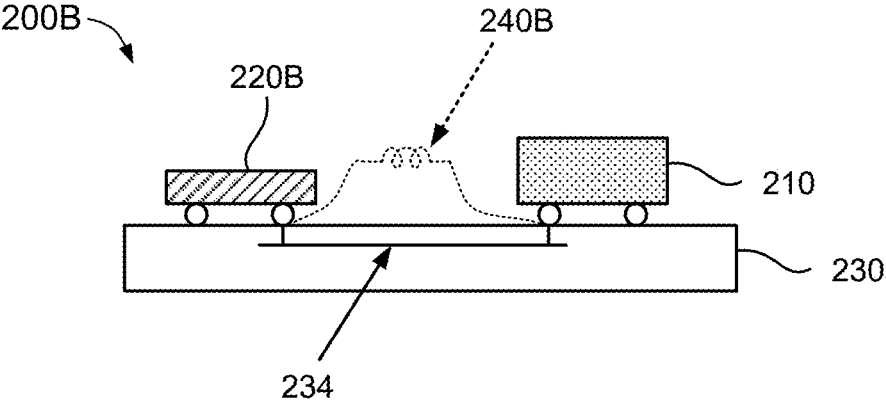

FIG. 2B illustrates another example circuit module 200B, according to aspects of the disclosure. As shown in FIG. 2B, the circuit module 200B may include an IC chip 210 and a resonator 220B mounted on the package substrate 230. The package substrate 230 may include an embedded conductive line 234. The IC chip 210 may be electrically coupled with the conductive line 234 through first bumps (not labeled), and the resonator 220B may be electrically coupled with the conductive line 234 through second bumps (not labeled). In some aspects, the resonator 220B and some electrical devices in the IC chip 210 may form an oscillator or a filter for operations of the IC chip 210. The second bumps, the conductive line 234, and the first bumps may also effectively introduce a parasitic device 240B (e.g., introducing parasitic inductance) between the IC chip 210 and the resonator 220B.

In some aspects, as shown in the example circuit modules 200A and 200B, the parasitic device 240A and 240B may cause additional losses between the resonator and the IC chip and may cause degradation of the Q factor of the resulting oscillator or filter. This may cause degradation of the performance of the resulting oscillator or filter. In addition, forming the resonator and the IC chip separately may increase the size of the final package. This may increase the manufacturing time and cost in aspects including at least, e.g., chip manufacturing, chip testing, package assembly, and package testing.

According to the present application, a MEMS-based resonator may be a monolithic-integrated BAW resonator that is integrated into an IC chip in order to resolve the aforementioned issues regarding having the resonator outside the IC chip. In some aspects, the monolithic-integrated BAW resonator may be formed based on modifying a metal-insulator-metal (MIM) capacitor (or a metal-oxide-metal (MOM) capacitor) manufacturing flow in a CMOS manufacturing process.

Figure 3:
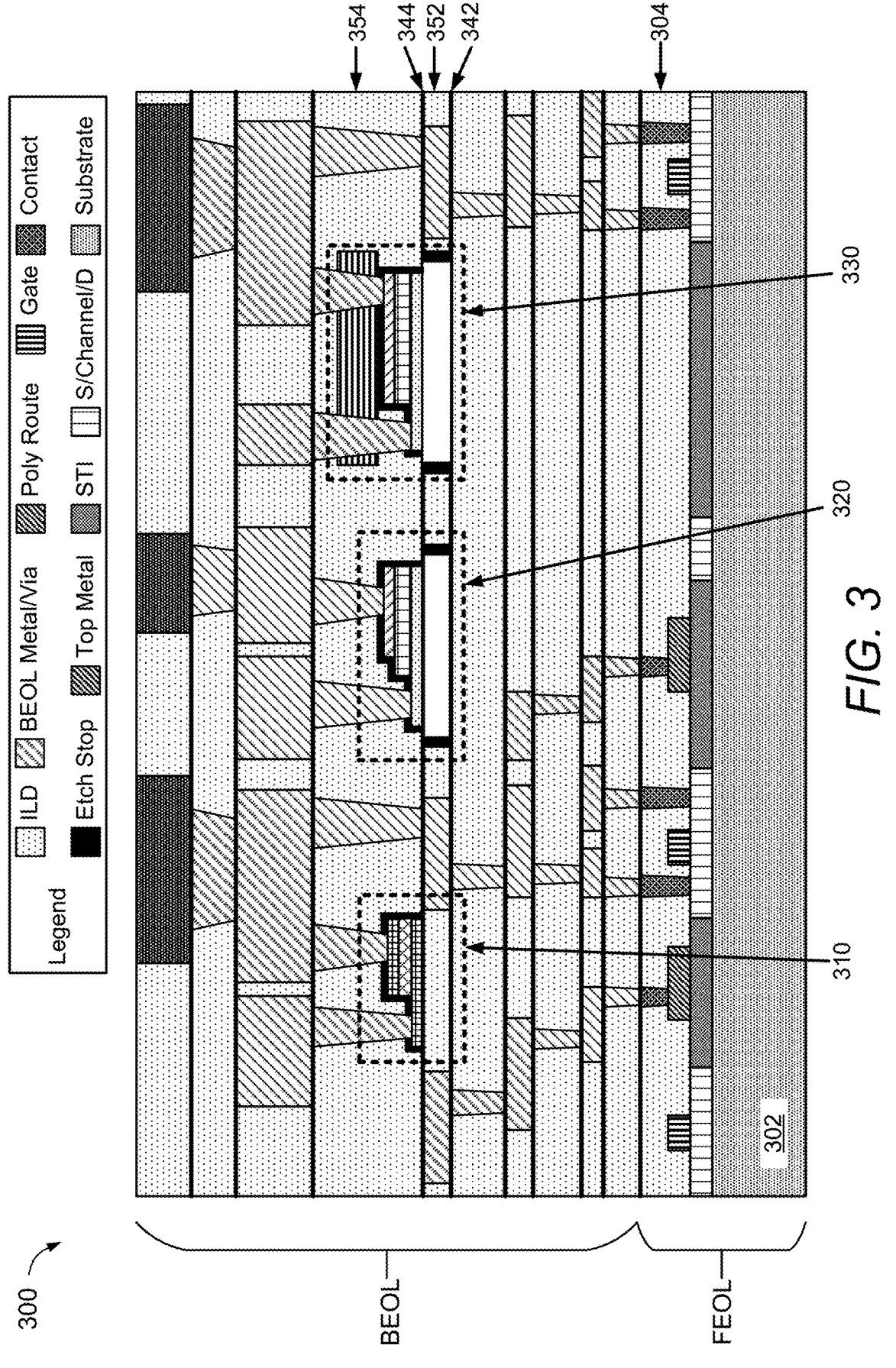
FIG. 3 is a cross-sectional view of a portion of an IC chip, according to aspects of the disclosure.

FIG. 3 is a cross-sectional view of a portion of an IC chip 300, according to aspects of the disclosure. The IC chip 300 shows a simplified example of an IC chip for illustrating an example MIM capacitor 310, an example BAW resonator 320, and an example solidly mounted resonator (SMR)-style modified BAW resonator (also referred to as an "SMR-BAW resonator" in this disclosure) 330. In some aspects, various elements of the IC chip 300 may have shapes and placements different from the example shown in FIG. 3, and other elements or configurations for the IC chip may be adopted in addition to the example shown in FIG. 3.

The IC chip 300 may include a substrate 302. The IC chip 300 may include various components formed on the substrate 302, such as the features depicted as sources, channels, and drains of transistors (the shade labeled as "S/Channel/D"), gates of the transistors (the shade labeled as "Gate"), polysilicon routes (the shade labeled as "Poly Route"), and shallow trench isolation (STI) structures (the shade labeled as "STI"). The IC chip 300 may include contact structures (the shade labeled as "Contact") that are coupled to the components formed on the substrate 302, such as the drains, sources, polysilicon routes, and gates (not shown). An interlayer dielectric (ILD) layer 304 (the shade labeled as "ILD") fills the space between the contact structures and covers the components formed on the substrate 302.

In some aspects, the portion of manufacturing flows for fabricating from the substrate 302 up to the ILD layer 304 may be collectively referred to as the front end of line (FEOL) process in this disclosure. In some aspects, the portion of manufacturing flows for fabricating the remaining of the IC chip 300 above the ILD layer 304 may be collectively referred to as the back end of line (BEOL) process in this disclosure.

On top of the ILD layer 304, multiple etch stop layers (the shade labeled as "Etch Stop") and ILD layers (the shade labeled as "ILD" above the ILD layer 304) may be formed one over another. Also, an interconnection structure may be formed by stacking multiple vias and conductive lines (the shade labeled as "BEOL Metal/Via") that are formed in respective ILD layers. In some aspects, some of the etch stop layers may be omitted or removed during the BEOL process. In addition, a top metal layer (the shade labeled as "Top Metal") may be formed in the uppermost ILD layer. The top metal layer may be configured as the base for forming bump pads, on which bump structures (not shown) of the IC chip 300 may be further formed.

The IC chip 300 may include a first etch stop layer 342 and a second etch stop layer 344 within the region of the IC chip 300 formed based on the BEOL process (or simply referred to as the BEOL portion). A first ILD layer 352 is between the first etch stop layer 342 and the second etch stop layer 344, and a second ILD layer 354 is on the second etch stop layer 344. In some aspects, the etch stop layers may include silicon nitride (e.g., SiN). In some aspects, the ILD layers may include silicon oxide (e.g., $SiO_2$).

In some aspects, the MIM capacitor 310 may be formed on the first ILD layer 352, and within the second ILD layer 354 on the second etch stop layer 344. In some aspects, the BAW resonator 320 may be formed based on the first etch stop layer 342, the first ILD layer 352, and the second etch stop layer 344, and partially embedded in the second ILD layer 354. In some aspects, the SMR-BAW resonator 330 may be formed based on the first etch stop layer 342, the first ILD layer 352, and the second etch stop layer 344, and partially embedded in the second ILD layer 354. Details of the MIM capacitor 310, the BAW resonator 320, and the SMR-BAW resonator 330 would be illustrated with reference to FIGS. 4A-4C.

In some aspects, a resonator based on the BAW resonator 320 and/or the SMR-BAW resonator 330 may be formed by modifying the manufacturing flow for making the MIM capacitor 310 (or a MOM capacitor). Therefore, a resonator based on the BAW resonator 320 and/or the SMR-BAW resonator 330 may be monolithic-integrated into the IC chip 300 and compatible with the CMOS manufacturing process (e.g., as part of the BEOL process). The monolithic-integrated resonators as described in this disclosure may replace the relatively more expensive crystal resonators. Also, by integrating the resonator into the IC chip, the resulting design may have a smaller package, as simplified package process (e.g., based on regular CMOS packaging like flip chip packaging, copper pillar bump (CuP) packaging, or quad flat no-lead (QFN) packaging, without extra bonding), with less parasitic effects (e.g., less degradation of the Q factor), and with less manufacturing costs.

Figure 4A:
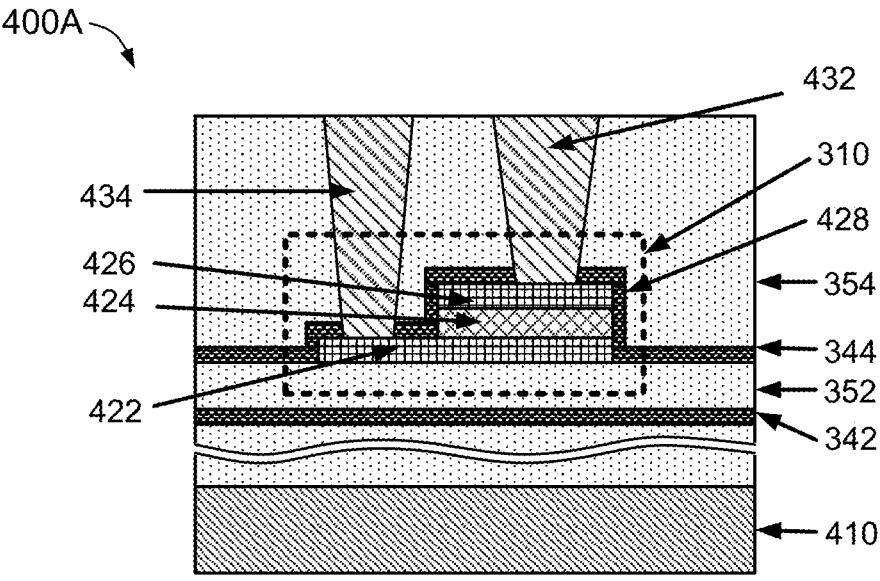
FIGS. 4A-4D are cross-sectional views of example components of an IC chip, according to aspects of the disclosure.

FIG. 4A is a cross-sectional view of a semiconductor structure 400A showing an example MIM capacitor of an IC chip, such as the MIM capacitor 310 of the IC chip 300, according to aspects of the disclosure. Components in FIG. 4A that are the same or similar to those in FIG. 3 may be depicted using the same shade and given the same reference numbers, and the detail description thereof may be omitted.

The semiconductor structure 400A may be part of the IC chip 300 in FIG. 3 and may include a FEOL portion 410 that correspond to the portion of the IC chip 300 manufactured based on the FEOL process (e.g., including the substrate 302 and various components formed thereon). Above the FEOL portion 410, there are multiple layers of etch stop layers and ILD layers, including at least the first etch stop layer 342, the second etch stop layer 344, the first ILD layer 352, and the second ILD layer 354.

The semiconductor structure 400A includes a lower metal 422 on the first ILD layer 352, a capacitor dielectric 424 on the lower metal 422, and an upper metal 426 on the capacitor dielectric 424. Another etch stop layer 428 may cover the sides and the top of the lower metal 422, the capacitor dielectric 424, and the upper metal 426 and may be coupled to the second etch stop layer 344. The lower metal 422, the capacitor dielectric 424, and the upper metal 426 may be configured as the main portion of the MIM capacitor 310.

The semiconductor structure 400A may include a first contact structure (e.g., a via) 432 passing through the second ILD layer 354 and the etch stop layer 428 and coupled to the upper metal 426. The semiconductor structure 400A may include a second contact structure (e.g., another via) 434 passing through the second ILD layer 354 and the etch stop layer 428 and coupled to the lower metal 422.

In some aspects, the lower metal 422 and the upper metal 426 may include copper, titanium nitride, platinum, aluminum, or any combination thereof. In some aspects, the capacitor dielectric 424 may include $SiO_2$, aluminum nitride (e.g., AlN), or any combination thereof.

Figure 4B:
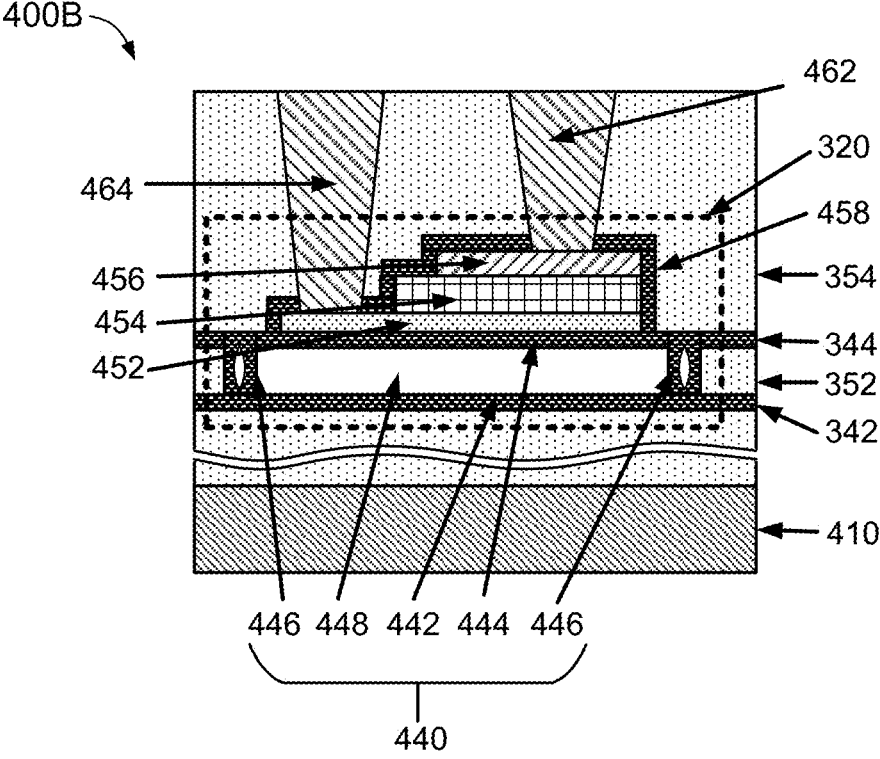

FIG. 4B is a cross-sectional view of a semiconductor structure 400B showing an example BAW resonator of an IC chip, such as the BAW resonator 320 of the IC chip 300, according to aspects of the disclosure. Components in FIG. 4B that are the same or similar to those in FIG. 3 may be depicted using the same shade and given the same reference numbers, and the detail description thereof may be omitted.

The semiconductor structure 400B may be part of the IC chip 300 in FIG. 3 and may include a FEOL portion 410 as illustrated with reference to FIG. 4A. Above the FEOL portion 410, there are multiple layers of etch stop layers and ILD layers, including at least the first etch stop layer 342, the second etch stop layer 344, the first ILD layer 352, and the second ILD layer 354.

The semiconductor structure 400B includes a cavity structure 440, a lower conductive structure 452 over the cavity structure 440, a piezoelectric layer 454 on the lower conductive structure 452 and over the cavity structure 440, and an upper conductive structure 456 on the piezoelectric layer 454. Another etch stop layer 458 may cover the sides and the top of the lower conductive structure 452, the piezoelectric layer 454, and the upper conductive structure 456, and may be coupled with the second etch stop layer 344. The cavity structure 440, the lower conductive structure 452, the piezoelectric layer 454, and the upper conductive structure 456 may be configured as the main portion of the BAW resonator 320.

In some aspects, the lower conductive structure 452 and the upper conductive structure 456 may include copper, titanium nitride, platinum, aluminum, or any combination thereof. In some aspects, the piezoelectric layer 454 may include aluminum nitride (e.g., AlN), aluminum scandium nitride (e.g., AlScN), or any combination thereof. In some aspects, depending on the design of the resonator, the lower conductive structure 452 and/or the upper conductive structure 456 may be patterned to achieve a desirable resonance frequency and/or Q factor.

Moreover, the cavity structure 440 may include a bottom 442 that is a part of the first etch stop layer 342, a top 444 that is a part of the second etch stop layer 344 over the first etch stop layer 342, and one or more sidewalls 446 connecting the bottom 442 and the top 444 of the cavity structure 440. The cavity structure 440 may include a cavity 448 between the top 444 and the bottom 442 and surrounded by the one or more sidewalls 446. In some aspects, the cavity 448 may be filled with air. In some aspects, the top 444, the bottom 442, and the one or more sidewalls 446 of the cavity structure 440 may include silicon nitride (e.g., SiN). In some aspects, as SiN has a temperature coefficient of frequency (TCF) of 3.27 ppm/° C., the top 444 of the cavity structure 440 may be configured as a TCF compensation structure for the BAW resonator 320 for compensating the TCF (usually being negative) of the piezoelectric layer 454.

The semiconductor structure 400B may include a first contact structure (e.g., a via) 462 passing through the second ILD layer 354 and the etch stop layer 458 and coupled to the upper conductive structure 456. The semiconductor structure 400B may include a second contact structure (e.g., another via) 464 passing through the second ILD layer 354 and the etch stop layer 458 and coupled to the lower conductive structure 452.

In some aspects, depending on the design of the resonator, the lower conductive structure 452 may be omitted. In some aspects, as the lower conductive structure 452 being omitted, and the second contact structure (e.g., another via) 464 may be coupled to the piezoelectric layer 454, the upper conductive structure 456, or electrically free from being coupled with the piezoelectric layer 454 or the upper conductive structure 456.

Figure 4C:
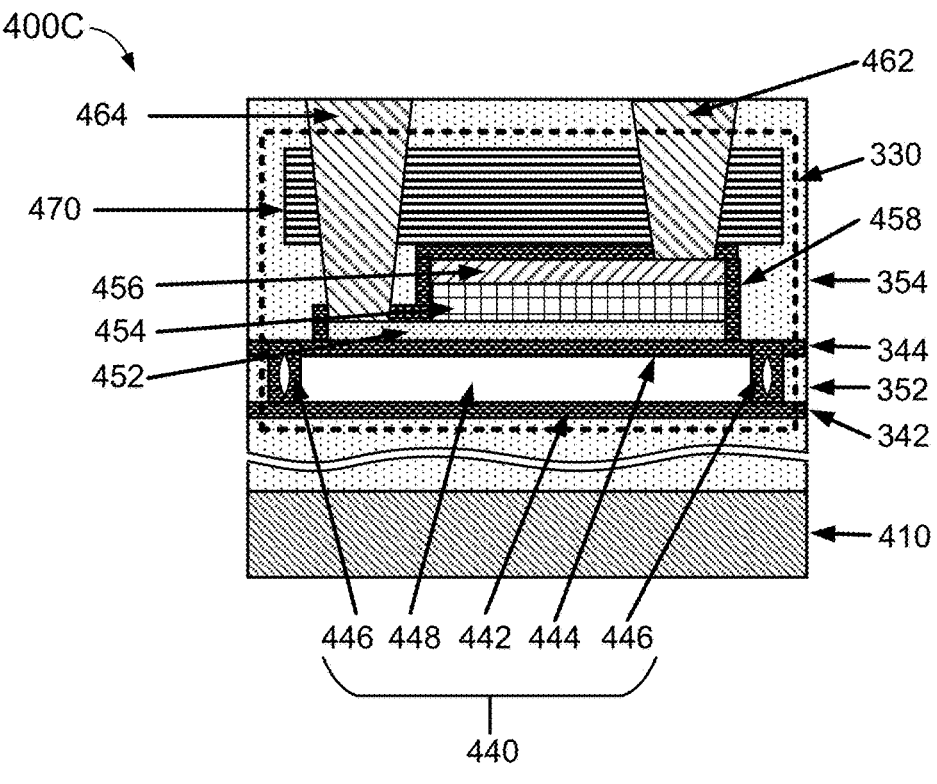

FIG. 4C is a cross-sectional view of a semiconductor structure 400C showing an example SMR-BAW resonator of an IC chip, such as the SMR-BAW resonator 330 of the IC chip 300, according to aspects of the disclosure. Components in FIG. 4C that are the same or similar to those in FIG. 4B may be depicted using the same shade and given the same reference numbers, and the detail description thereof may be omitted.

The semiconductor structure 400C may be part of the IC chip 300 in FIG. 3 and may include a FEOL portion 410 as illustrated with reference to FIG. 4A. Above the FEOL portion 410, there are multiple layers of etch stop layers and ILD layers, including the first etch stop layer 342, the second etch stop layer 344, the first ILD layer 352, and the second ILD layer 354.

Compared with the semiconductor structure 400B, the semiconductor structure 400C further includes an acoustic reflecting structure 470 over the upper conductive structure 456. In some aspects, the acoustic reflecting structure 470 may include layers of refractory materials, and the refractory materials may include tungsten, titanium, tantalum oxide, or any combination thereof. In some aspects, the acoustic reflecting structure 470 may be a Bragg reflector.

Figure 4D:
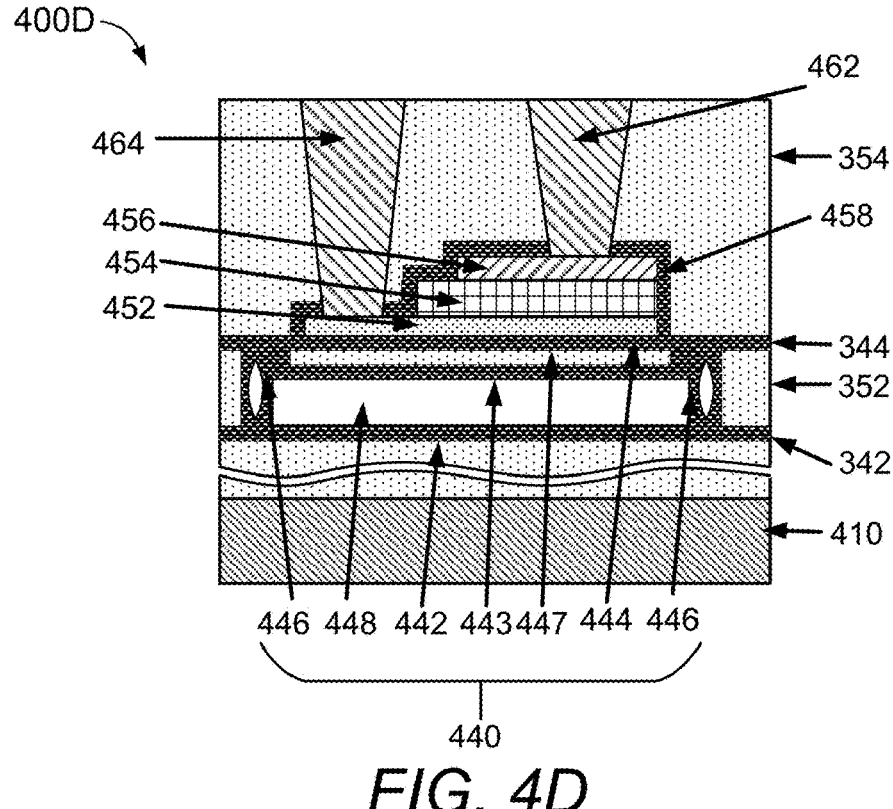

FIG. 4D is a cross-sectional view of a semiconductor structure 400D showing an example BAW resonator of an IC chip, according to aspects of the disclosure. Components in FIG. 4D that are the same or similar to those in FIG. 4B may be depicted using the same shade and given the same reference numbers, and the detail description thereof may be omitted.

Compared with the semiconductor structure 400B, the cavity structure 440 of the semiconductor structure 400D further includes an intermediate etch stop layer 443 and a dielectric layer 447 between the top 444 of the cavity structure 440 and the intermediate etch stop layer 443. The cavity is between the intermediate etch stop layer 443 and the bottom 442 of the cavity structure 440. In some aspects, the combination of the top 444 of the cavity structure 440, the intermediate etch stop layer 443, and the dielectric layer 447 disposed therebetween may be configured as a TCF compensation structure for the BAW resonator. In some aspects, the intermediate etch stop layer 443 may include silicon nitride (e.g., SiN). In some aspects, the dielectric layer 447 may include silicon oxide (e.g., $SiO_2$).

Figure 5A:
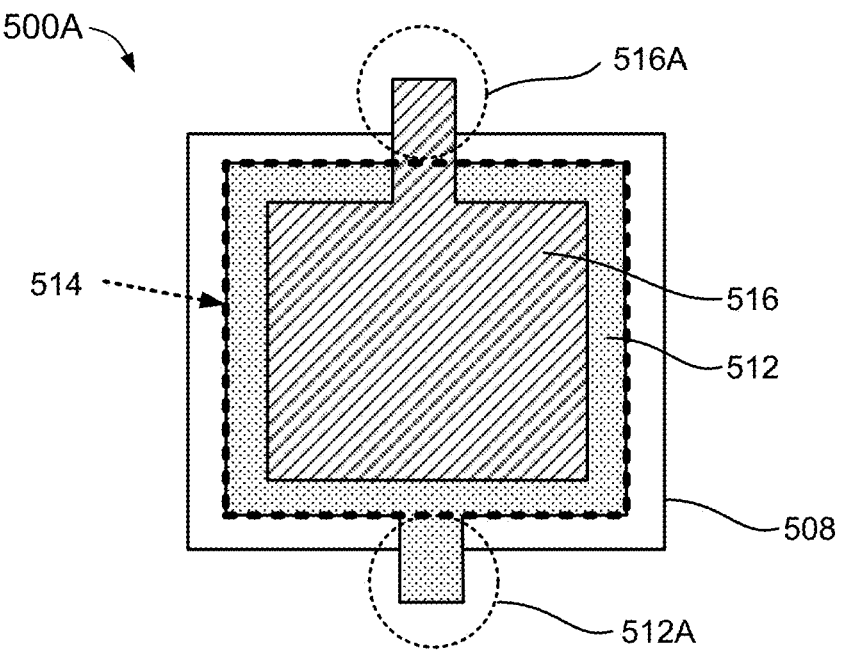
FIGS. 5A-5D are top views illustrating example layouts of a cavity of a cavity structure, a lower conductive structure, a piezoelectric layer, and an upper conductive structure of a resonator, according to aspects of the disclosure.

FIG. 5A is a top view illustrating an example layout 500A of a cavity 508 of a cavity structure, a lower conductive structure 512, a piezoelectric layer 514, and an upper conductive structure 516 of a resonator, according to aspects of the disclosure. In some aspects, the resonator based on FIG. 5A may correspond to the resonator based on the semiconductor structure 400B in FIG. 4B; the cavity 508 may correspond to the cavity 448; the lower conductive structure 512 may correspond to the lower conductive structure 452; the piezoelectric layer 514 may correspond to the piezoelectric layer 454; and the upper conductive structure 516 may correspond to the upper conductive structure 456.

In this example, the lower conductive structure 512 may include a lower pattern portion aligned over the cavity 508 and a lower anchor portion 512A coupled to the lower pattern portion. The upper conductive structure 516 may include an upper pattern portion aligned over the cavity 508 and overlapping the lower pattern portion of the lower conductive structure 512. The upper conductive structure 516 may further include an upper anchor portion 516A coupled to the upper pattern portion. In some aspects, the lower pattern portion of the lower conductive structure 512 may have a lower patch pattern (e.g., a rectangular patch), and the upper pattern portion of the upper conductive structure 516 may have an upper patch pattern (e.g., a rectangular patch). In some aspects, the first contact structure 462 in FIG. 4B may be coupled to the upper anchor portion 516A, and the second contact structure 464 in FIG. 4B may be coupled to the lower anchor portion 512A.

Figure 5B:
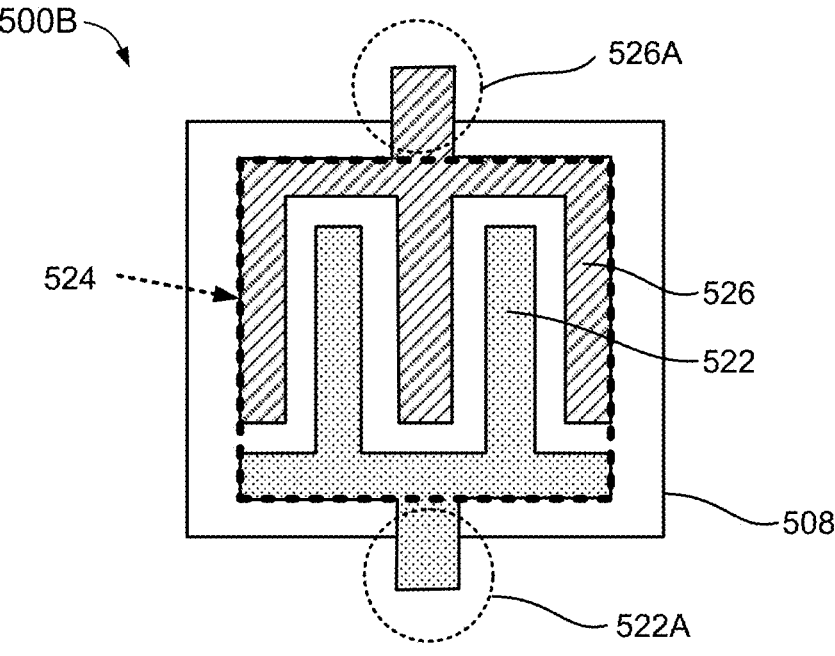

FIG. 5B is a top view illustrating another example layout 500B of a cavity 508 of a cavity structure, a lower conductive structure 522, a piezoelectric layer 524, and an upper conductive structure 526 of a resonator, according to aspects of the disclosure. In some aspects, the resonator based on FIG. 5B may correspond to the resonator based on the semiconductor structure 400B in FIG. 4B; the cavity 508 may correspond to the cavity 448; the lower conductive structure 522 may correspond to the lower conductive structure 452; the piezoelectric layer 524 may correspond to the piezoelectric layer 454; and the upper conductive structure 526 may correspond to the upper conductive structure 456.

In this example, the lower conductive structure 522 may include a lower finger portion aligned over the cavity 508 and a lower anchor portion 522A coupled to the lower finger portion. The upper conductive structure 526 may include an upper finger portion aligned over the cavity 508 without overlapping the lower finger portion of the lower conductive structure 522. The upper conductive structure 526 may further include an upper anchor portion 526A coupled to the upper finger portion. In some aspects, the first contact structure 462 in FIG. 4B may be coupled to the upper anchor portion 526A, and the second contact structure 464 in FIG. 4B may be coupled to the lower anchor portion 522A.

Figure 5C:
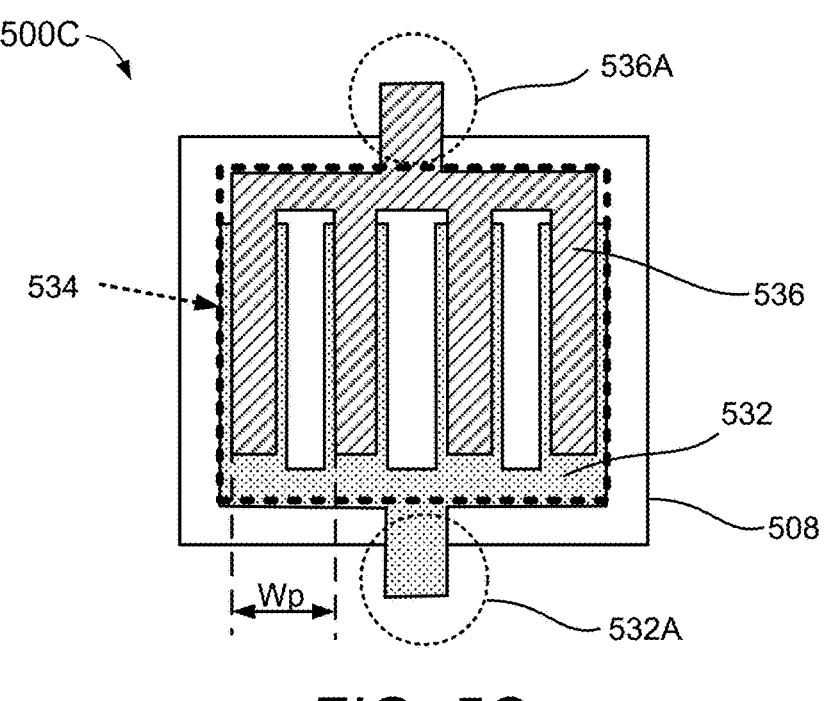

FIG. 5C is a top view illustrating an example layout 500C of a cavity 508 of a cavity structure, a lower conductive structure 532, a piezoelectric layer 534, and an upper conductive structure 536 of a resonator, according to aspects of the disclosure. In some aspects, the resonator based on FIG. 5C may correspond to the resonator based on the semiconductor structure 400B in FIG. 4B; the cavity 508 may correspond to the cavity 448; the lower conductive structure 532 may correspond to the lower conductive structure 452; the piezoelectric layer 534 may correspond to the piezoelectric layer 454; and the upper conductive structure 536 may correspond to the upper conductive structure 456.

In this example, the lower conductive structure 532 may include a lower pattern portion aligned over the cavity 508 and a lower anchor portion 532A coupled to the lower pattern portion. The upper conductive structure 536 may include an upper pattern portion aligned over the cavity 508 and at least partially overlapping the lower pattern portion of the lower conductive structure 532. The upper conductive structure 536 may further include an upper anchor portion

536A coupled to the upper pattern portion. In some aspects, the lower pattern portion of the lower conductive structure 532 may have a lower finger pattern, and the upper pattern portion of the upper conductive structure 536 may have an upper finger pattern. In some aspects, the first contact structure 462 in FIG. 4B may be coupled to the upper anchor portion 536A, and the second contact structure 464 in FIG. 4B may be coupled to the lower anchor portion 532A.

Figure 5D:
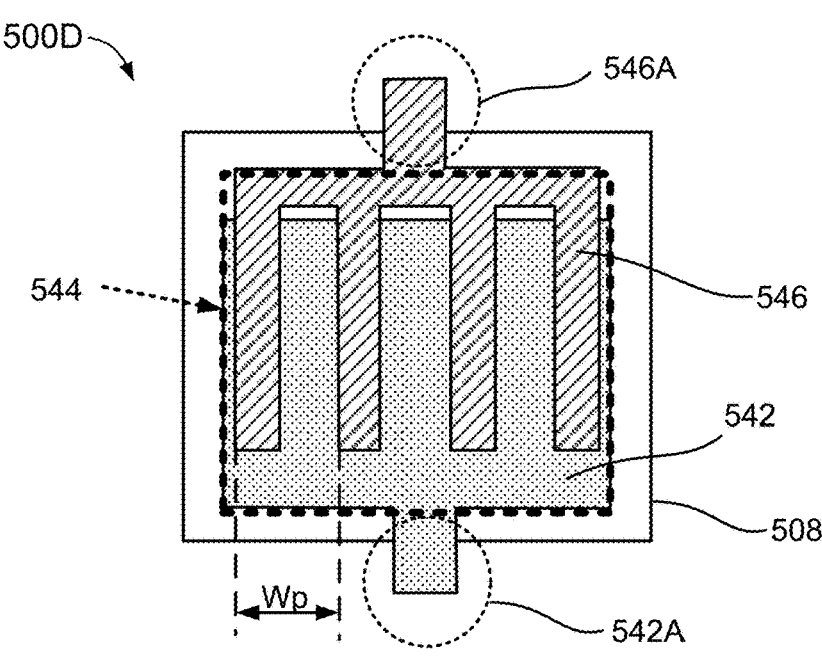

FIG. 5D is a top view illustrating an example layout 500D of a cavity 508 of a cavity structure, a lower conductive structure 542, a piezoelectric layer 544, and an upper conductive structure 546 of a resonator, according to aspects of the disclosure. In some aspects, the resonator based on FIG. 5D may correspond to the resonator based on the semiconductor structure 400B in FIG. 4B; the cavity 508 may correspond to the cavity 448; the lower conductive structure 542 may correspond to the lower conductive structure 452; the piezoelectric layer 544 may correspond to the piezoelectric layer 454; and the upper conductive structure 546 may correspond to the upper conductive structure 456.

In this example, the lower conductive structure 542 may include a lower pattern portion aligned over the cavity 508 and a lower anchor portion 532A coupled to the lower pattern portion. The upper conductive structure 546 may include an upper pattern portion aligned over the cavity 508 and at least partially overlapping the lower pattern portion of the lower conductive structure 542. The upper conductive structure 546 may further include an upper anchor portion 546A coupled to the upper pattern portion. In some aspects, the lower pattern portion of the lower conductive structure 542 may have a lower patch pattern (e.g., a rectangular patch), and the upper pattern portion of the upper conductive structure 546 may have an upper finger pattern. In some aspects, the first contact structure 462 in FIG. 4B may be coupled to the upper anchor portion 546A, and the second contact structure 464 in FIG. 4B may be coupled to the lower anchor portion 542A.

Moreover, the resonance behavior of the resulting resonator may be tunable based on varying the dimensions and materials of the resonator. For example, with reference to FIGS. 5C and 5D, the resonance behavior of the resonator based on the example layout 500C or based on the example layout 500D may be tunable based on the finger pitch (labeled as "Wp") of the upper conductive structure 536 or 546, the thickness of the piezoelectric layer 534 or 544, the thickness of the upper conductive structure 536 or 546, the thickness of the lower conductive structure 532 or 542, or any combination thereof.

FIG. 6A is a cross-sectional view of a semiconductor structure 600A showing an example BAW resonator of an IC chip, according to aspects of the disclosure. The BAW resonator in FIG. 6A may be based on a variation of the BAW resonator in FIG. 4B. Components in FIG. 6A that are the same or similar to those in FIG. 4B may be depicted using the same shade and given the same reference numbers, and the detail description thereof may be omitted.

Compared with the semiconductor structure 400B, the semiconductor structure 600A does not include the lower conductive structure 452. Therefore, the piezoelectric layer 454 is on the top 444 of the cavity structure 440.

FIG. 6B is a top view illustrating an example layout 600B of a cavity 608 of a cavity structure, a piezoelectric layer 614, and an upper conductive structure 616 of a resonator, according to aspects of the disclosure. In some aspects, the resonator based on FIG. 6B may correspond to the resonator based on the semiconductor structure 600A in FIG. 6A; the cavity 608 may correspond to the cavity 448; the piezoelectric layer 614 may correspond to the piezoelectric layer 454; and the upper conductive structure 616 may correspond to the upper conductive structure 456.

In this example, the upper conductive structure 616 may include an upper pattern portion aligned over the cavity 608 and an upper anchor portion 616A coupled to the upper pattern portion. In some aspects, the upper pattern portion of the upper conductive structure 626 may have an upper patch pattern (e.g., a rectangular patch). In some aspects, the first contact structure 462 in FIG. 6A may be coupled to the upper anchor portion 616A. In some aspects, the second contact structure 464 in FIG. 6A may be coupled to the piezoelectric layer 614.

FIG. 6C is a top view illustrating an example layout 600C of a cavity 608 of a cavity structure, a piezoelectric layer 624, and an upper conductive structure 626 of a resonator, according to aspects of the disclosure. In some aspects, the resonator based on FIG. 6C may correspond to the resonator based on the semiconductor structure 600A in FIG. 6A; the cavity 608 may correspond to the cavity 448; the piezoelectric layer 624 may correspond to the piezoelectric layer 454; and the upper conductive structure 626 may correspond to the upper conductive structure 456.

In this example, the upper conductive structure 626 may include an upper pattern portion aligned over the cavity 608 and an upper anchor portion 626A coupled to the upper pattern portion. In some aspects, the upper pattern portion of the upper conductive structure 626 may have an upper finger pattern. In some aspects, the first contact structure 462 in FIG. 6A may be coupled to the upper anchor portion 626A. In some aspects, the second contact structure 464 in FIG. 6A may be coupled to the piezoelectric layer 624.

Also, the resonance behavior of the resulting resonator may be tunable based on varying dimensions and materials of the resonator. For example, with reference to FIG. 6C, the resonance behavior of the resonator based on the example layout 600C may be tunable based on the finger pitch (labeled as "Wp") of the upper conductive structure 626, the thickness of the piezoelectric layer 624, the thickness of the upper conductive structure 626, or any combination thereof.

Figure 7A:
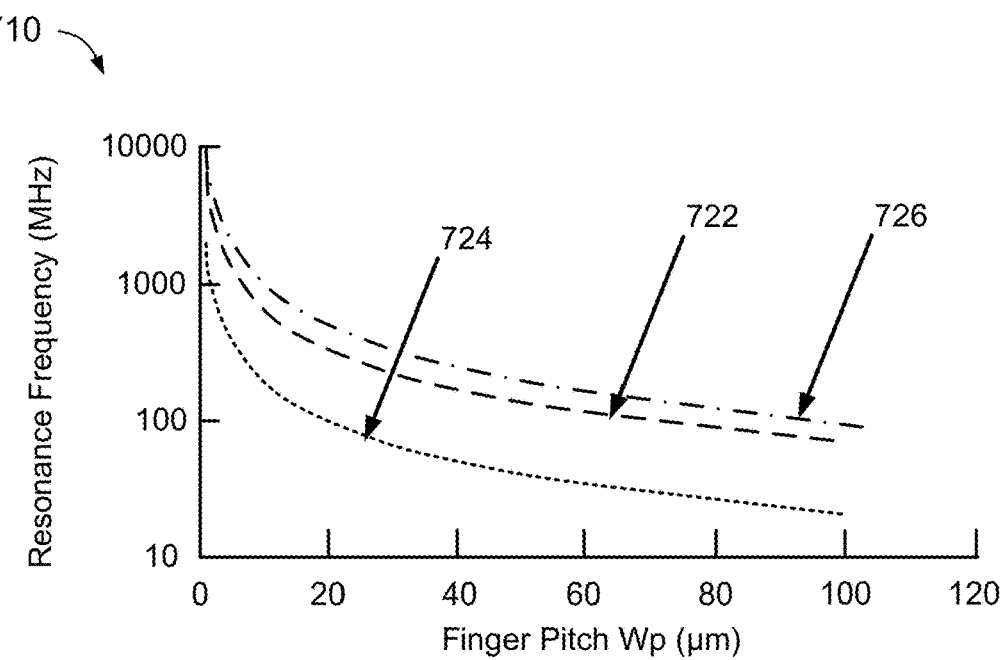
FIG. 7A is a diagram illustrating the relationship between a resonance frequency and a finger pitch of an example resonator based on the layouts of FIGS. 5C and 6C, according to aspects of the disclosure.

FIG. 7A is a diagram 710 illustrating the relationship between a resonance frequency and a finger pitch of an example resonator based on the layouts 500C and 600C of FIGS. 5C and 6C, according to aspects of the disclosure. The horizontal axis represents the finger pitch Wp in units of micrometers (μm), and the vertical axis represents the resonance frequency in units of megahertz (MHz). The thickness of the piezoelectric layer 534 or 624 is set to 2 μm.

As shown in FIG. 7A, the curve 722 corresponds to a resonator based on FIG. 5C, with the lower conductive structure 532 and the upper conductive structure 536 having a thinner thickness. The curve 724 corresponds to a resonator based on FIG. 5C, with the lower conductive structure 532 and the upper conductive structure 536 having a thicker thickness. The curve 726 corresponds to a resonator based on FIG. 6C.

Figure 7B:
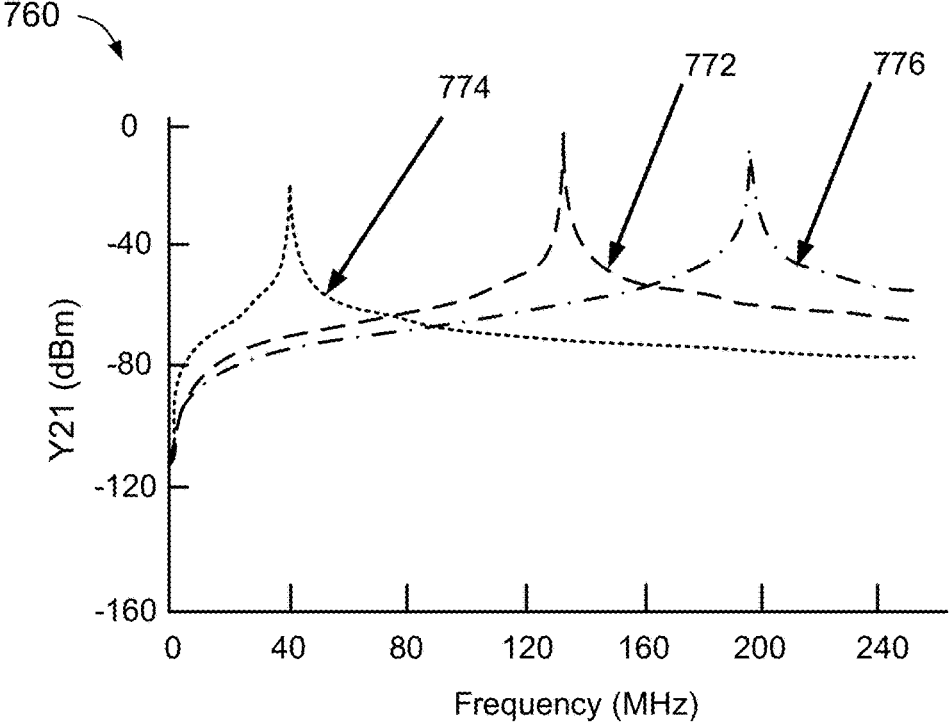
FIG. 7B is a diagram illustrating the frequency responses of example resonators based on the layouts of FIGS. 5C and 6C, according to aspects of the disclosure.

FIG. 7B is a diagram 760 illustrating the frequency responses of example resonators based on the layouts 500C and 600C of FIGS. 5C and 6C, according to aspects of the disclosure. The horizontal axis represents the frequency in units of megahertz (MHz), and the vertical axis represents the transconductance (Y21) of the resulting resonator in units of dBm. Also, the finger pitch Wp may be set to 50 μm.

As shown in FIG. 7B, the curve 772 corresponds to a resonator based on FIG. 5C, with the lower conductive structure 532 and the upper conductive structure 536 having a thinner thickness. The curve 774 corresponds to a resonator based on FIG. 5C, with the lower conductive structure 532 and the upper conductive structure 536 having a thicker thickness. The curve 776 corresponds to a resonator based on FIG. 6C.

Accordingly, the resonance frequency and frequency response of a resonator as illustrated in the present disclosure may be determinable based on the presence or absence of the lower conductive structure, the shape of the pattern of the upper conductive structure or the lower conductive structure, the thickness of the conductive structures, the thickness of the piezoelectric layer, the material of the piezoelectric layer, the finger pitch of the conductive structure, or any combination thereof.

Figure 8A:
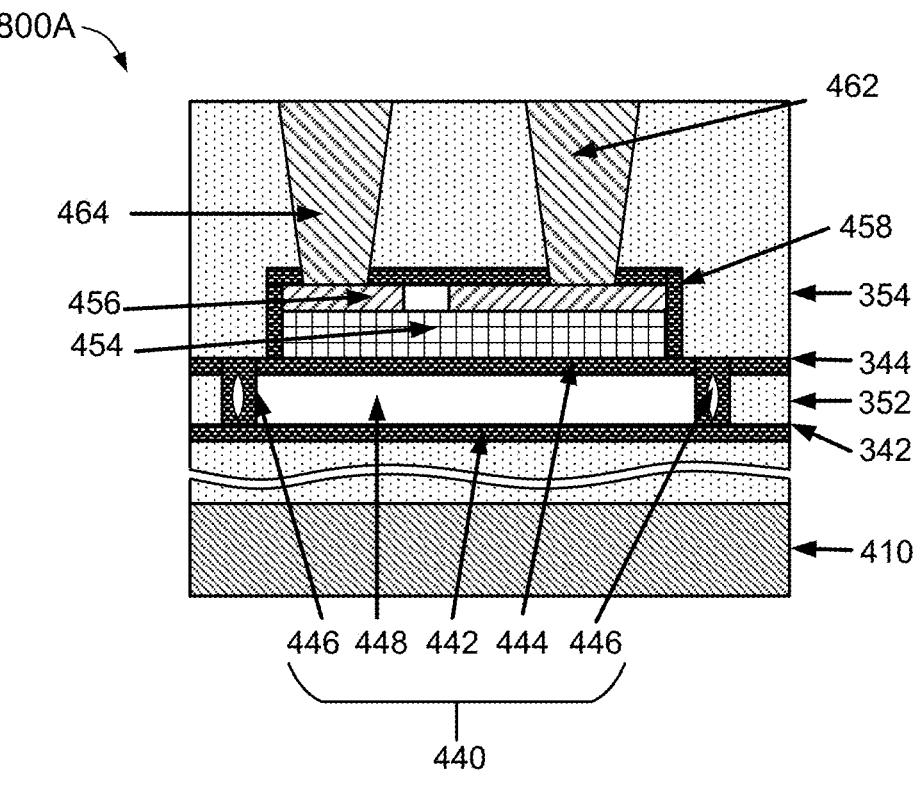
FIG. 8A is a cross-sectional view of a semiconductor structure showing an example resonator of an IC chip, according to aspects of the disclosure.

FIG. 8A is a cross-sectional view of a semiconductor structure 800A showing an example resonator of an IC chip, according to aspects of the disclosure. The resonator in FIG. 8A may have a configuration based on a variation of the BAW resonator in FIG. 4B. Components in FIG. 8A that are the same or similar to those in FIG. 4B may be depicted using the same shade and given the same reference numbers, and the detail description thereof may be omitted.

Compared with the semiconductor structure 400B, the semiconductor structure 800A does not include the lower conductive structure 452. Therefore, the piezoelectric layer 454 is on the top 444 of the cavity structure 440. Also, the upper conductive structure 456 may be patterned to include different portions respectively coupled to the first contact structure 462 and the second contact structure 464 (and possible one or more other contact structures).

Figure 8B:
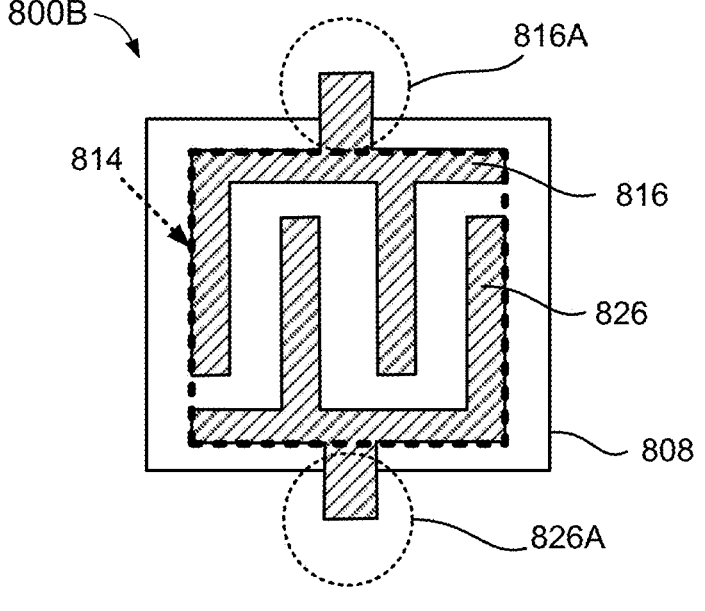

FIG. 8B is a top view illustrating an example layout 800B of a cavity 808 of a cavity structure, a piezoelectric layer 814, and an upper conductive structure (e.g., the combination of two parts 816 and 826) of a resonator, according to aspects of the disclosure. In some aspects, the resonator based on FIG. 8B may correspond to the resonator based on the semiconductor structure 800A in FIG. 8A; the cavity 808 may correspond to the cavity 448; the piezoelectric layer 814 may correspond to the piezoelectric layer 454; and the combination of two parts 816 and 826 may correspond to the upper conductive structure 456.

In this example, the upper conductive structure may include a first part 816 that has a first upper pattern portion aligned over the cavity 808 and a first upper anchor portion 816A coupled to the first upper pattern portion; and a second part 826 that has a second upper pattern portion aligned over the cavity 808 and a second upper anchor portion 826A coupled to the second upper pattern portion. In some aspects, the first upper pattern portion and the second upper pattern portion are arranged without overlapping each other. In some aspects, the first contact structure 462 in FIG. 8A may be coupled to the first upper anchor portion 816A. In some aspects, the second contact structure 464 in FIG. 8A may be coupled to the second upper anchor portion 826A.

Similar to the resonator designs illustrated with reference to FIGS. 5A-6C, the resonance behavior of the resulting resonator based on FIG. 8B may be tunable based on varying the dimensions and materials of the resonator, such as the shape of the pattern of the upper conductive structure, the thickness of the conductive structure, the thickness of the piezoelectric structure, the material of the piezoelectric layer, the finger pitch of the conductive structure, or any combination thereof.

FIG. 8C is a top view illustrating an example layout 800C of a cavity 808 of a cavity structure, a piezoelectric layer 814, and an upper conductive structure (e.g., the combination of multiple parts 832, 834, 835, 836, and 837) of a resonator, according to aspects of the disclosure. In some aspects, the resonator based on FIG. 8C may correspond to the resonator based on the semiconductor structure 800A in FIG. 8A, based on a lame mode resonator design. In some aspects, the cavity 808 may correspond to the cavity 448; the piezoelectric layer 814 may correspond to the piezoelectric layer 454; and the upper conductive structure (including parts 832, 834, 835, 836, and 837) may correspond to the upper conductive structure 456.

In this example, the upper conductive structure may include the part 832 that is arranged as a vibration pattern aligned over the cavity and aligned over the piezoelectric layer 814. In some aspects, the vibration pattern may include multiple mechanical tethers 833. In some aspects, the vibration pattern may include windows 842 formed therein. The upper conductive structure may further include parts 834, 835, 836, and 837 configured as multiple input/output terminals capacitively coupled with the vibration pattern. For example, the 834 may be configured as a non-inverted input terminal; part 835 may be configured as an inverted input terminal; part 836 may be configured as a non-inverted output terminal; and part 837 may be configured as an inverted output terminal.

FIG. 8D is a top view illustrating an example layout 800D of a cavity 808 of a cavity structure, a piezoelectric layer 814, and an upper conductive structure (e.g., the combination of multiple parts 832, 834, 835, 836, and 837) of a resonator, according to aspects of the disclosure. In some aspects, the resonator in FIG. 8D may be based on a lame mode resonator design and may be a variation of the resonator based on FIG. 8C. Compared with the example layout 800C, the vibration pattern of the part 832 in the example layout 800D may include windows 842 formed therein, and the windows 844 may have a shape different from those of the windows 842. In some aspects, the resonance behavior of the resulting resonators based on FIGS. 8C and 8D may be different due to the different shapes of the windows 842 and 844 in the vibration pattern.

FIG. 8E is a diagram 860 illustrating the frequency responses of example resonators based on the layouts 800C and 800D of FIGS. 8C and 8D, according to aspects of the disclosure. The horizontal axis represents the frequency in units of megahertz (MHZ), and the vertical axis represents the transconductance (Y21) of the resulting resonator in units of dBm.

As shown in FIG. 8E, the curve 872 corresponds to a resonator based on FIG. 8C, and the curve 874 corresponds to a resonator based on FIG. 8D. Accordingly, the resonance frequency and frequency response of a resonator as illustrated in the present disclosure may be determinable further based on the shape of the pattern of the conductive structure (s), such as whether there are windows formed therein and the shape of the windows.

FIGS. 9A-9K illustrate an example partial method for manufacturing a semiconductor structure (such as the semiconductor structure 400B in FIG. 4B), according to aspects of the disclosure. An IC (e.g., the IC chip 300) may include one or more transistors on a substrate and an interconnection structure on the one or more transistors. In some aspects, the interconnection structure may include a plurality of interconnection layers, a plurality of interlayer dielectric layers, and a semiconductor structure (such as the semiconductor structure 400B or the semiconductor structure 900K) embedded in the interconnection structure.

Figure 9A:
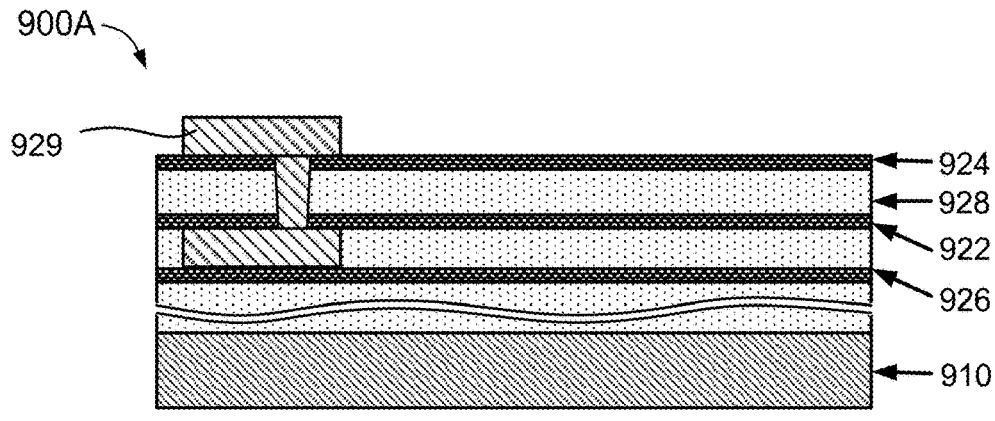
FIGS. 9A-9K illustrate an example partial method for manufacturing a semiconductor structure, according to aspects of the disclosure.

As shown in FIG. 9A, a semiconductor structure 900A is formed. The semiconductor structure 900A includes a FEOL portion 910 that correspond to the portion of an IC chip manufactured based on a FEOL process. In some aspects, the FEOL portion 910 may include a substrate and one or more electrical components formed on the substrate. Above the FEOL portion 910, there are multiple layers of etch stop layers and ILD layers that are formed based on at least a portion of a BEOL process. The portion of the semiconductor structure 900A above the FEOL portion 910 may include at least the first etch stop layer 922, the second etch stop layer 924, one or more other etch stop layer 926, a first ILD layer 352, and the second ILD layer 928. Moreover, an interconnection structure 929 may be formed by stacking multiple vias and conductive lines that are formed in respective ILD layers. In some aspects, the etch stop layers may include silicon nitride (e.g., SiN). In some aspects, the ILD layers may include silicon oxide (e.g., SiO2).

Figure 9B:
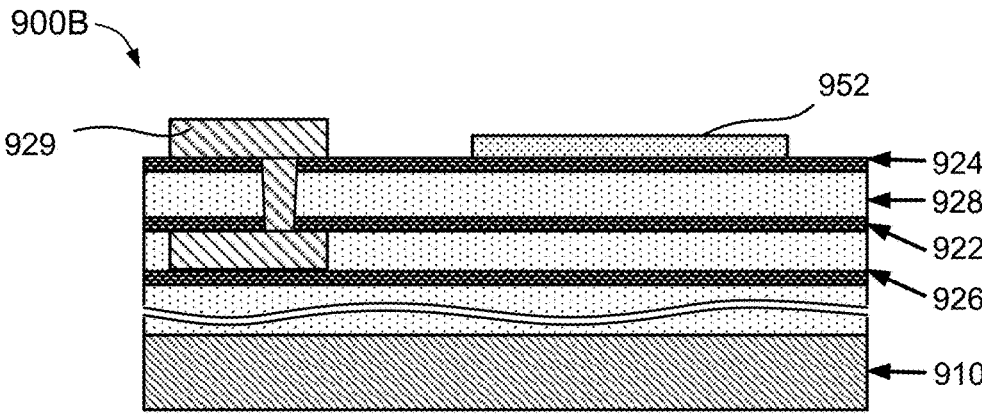

As shown in FIG. 9B, a semiconductor structure 900B is formed based on the semiconductor structure 900A by forming a lower conductive structure 952 on the second etch stop layer 924. In some aspects, the lower conductive structure 952 may include copper, titanium nitride, platinum, aluminum, or any combination thereof. In some aspects, the forming the lower conductive structure 952 may include depositing a layer of conductive material on the second etch stop layer 924 and then patterning the layer of conductive materials.

Figure 9C:
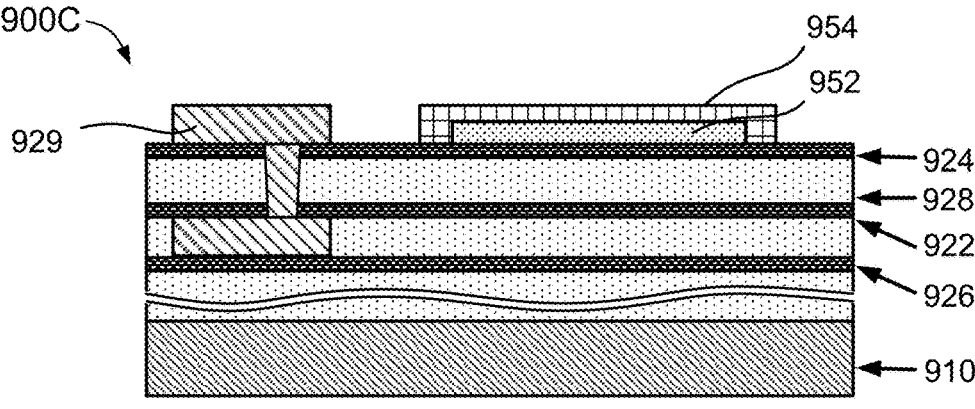

As shown in FIG. 9C, a semiconductor structure 900C is formed based on the semiconductor structure 900B by forming a piezoelectric layer 954 on the lower conductive structure 952. In some aspects, the piezoelectric layer 954 may include aluminum nitride (e.g., AlN), aluminum scandium nitride (e.g., AlScN), or any combination thereof. In some aspects, the forming the piezoelectric layer 954 may include depositing a layer of piezoelectric material on the lower conductive structure 952 and then patterning the layer of conductive materials.

In some aspects, when the lower conductive structure 952 is omitted, the process corresponding to FIG. 9B may be omitted. In such scenario, the piezoelectric layer 954 may be formed on the second etch stop layer 924.

Figure 9D:
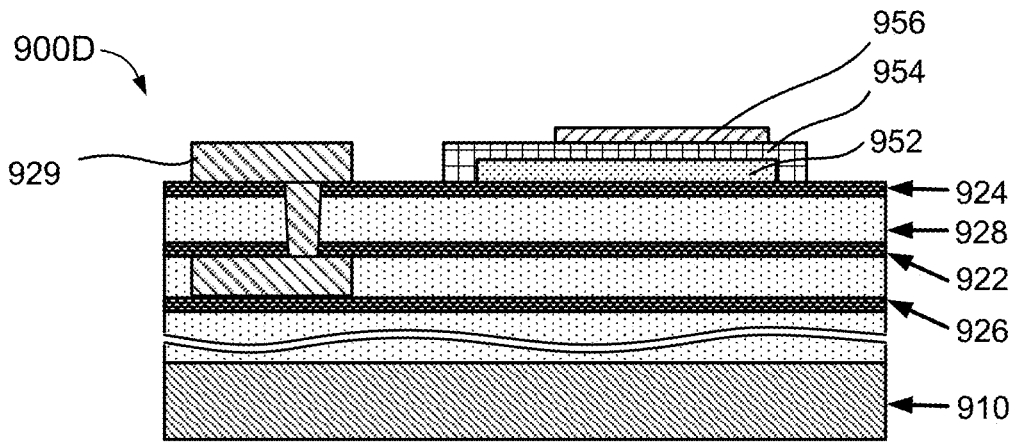

As shown in FIG. 9D, a semiconductor structure 900D is formed based on the semiconductor structure 900C by forming an upper conductive structure 956 on the piezoelectric layer 954. In some aspects, the upper conductive structure 956 may include copper, titanium nitride, platinum, aluminum, or any combination thereof. In some aspects, the forming the upper conductive structure 956 may include depositing a layer of conductive material on the piezoelectric layer 954 and then patterning the layer of conductive materials.

In some aspects, the operations corresponding to FIGS. 9B-9D may be based on at least partially a manufacturing flow for making an MIM capacitor or a MOM capacitor. in some aspects, the operations corresponding to FIGS. 9B-9D may be based on a manufacturing flow similar to that of making an MIM capacitor or a MOM capacitor. In some aspects, the operations corresponding to FIGS. 9B-9D may take place after the MIM capacitor or the MOM capacitor, if any, is formed on the second ILD layer 928, and the MIM capacitor or the MOM capacitor may be covered by a layer of etch stop material (e.g., SiN) before the operations corresponding to FIGS. 9B-9D.

Figure 9E:
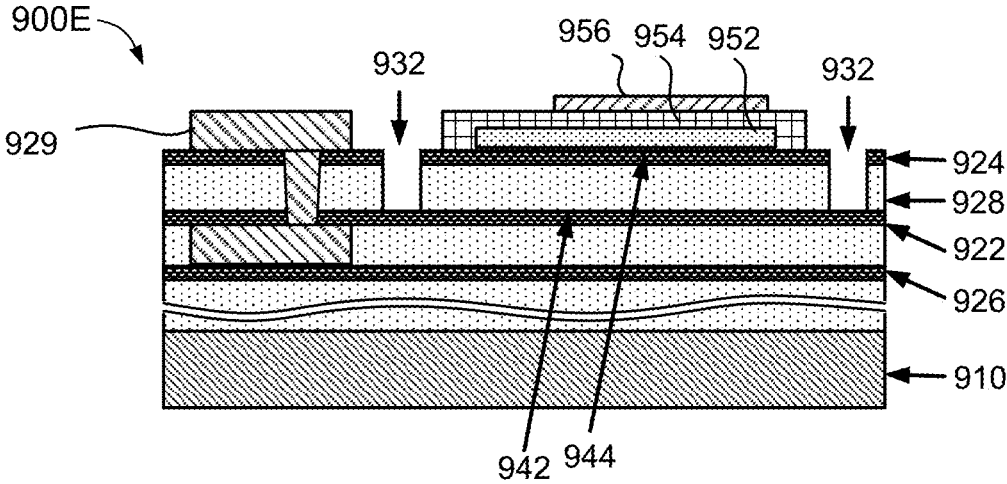

As shown in FIG. 9E, a semiconductor structure 900E is formed based on the semiconductor structure 900D by forming one or more openings 932 through at least the second etch stop layer 924 and the second ILD layer 928 while keeping the stack of the lower conductive structure 952, the piezoelectric layer 954, and the upper conductive structure 956 intact. In some aspects, the one or more openings 932 may be formed based on an anisotropic etching process or an isotropic etching process.

In some aspects, the one or more openings 932 may define a portion of the first etch stop layer 922 within a region exposed by the one or more openings 932 as a bottom 942 of a to-be-formed cavity structure (e.g., the cavity structure 940 in FIG. 9I); and a portion of the second etch stop layer 924 surrounded by the one or more openings 932 as a top 944 of the to-be-formed cavity structure.

Figure 9F:
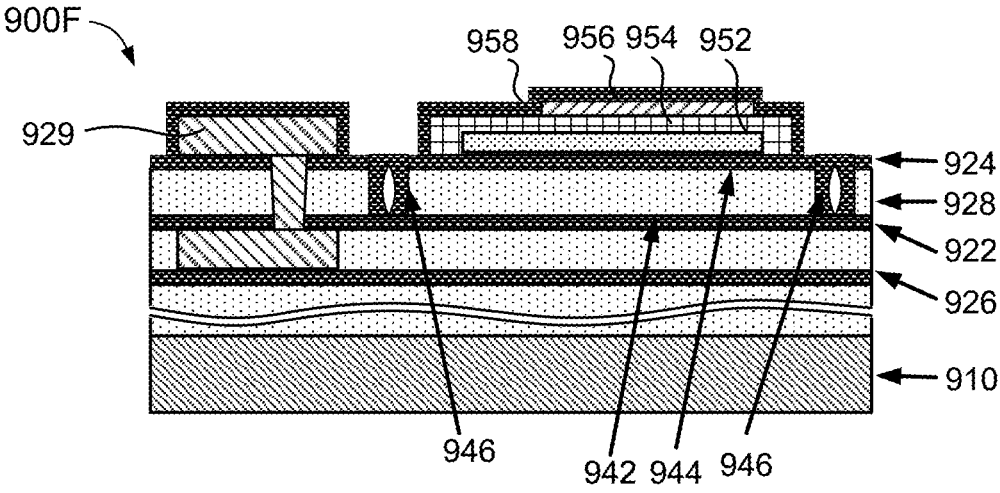

As shown in FIG. 9F, a semiconductor structure 900F is formed based on the semiconductor structure 900E by performing a etch stop material (e.g., SiN) deposition to fill the one or more openings 932. The etch stop material deposition also form an etch stop layer (not labeled) covering the top portion of the interconnection structure 929 and an etch stop layer 958 covering the sides and the top of the lower conductive structure 952, the piezoelectric layer 954, and the upper conductive structure 956.

In some aspects, the etch stop material deposition at least partially fills and converts the one or more openings 932 into one or more sidewalls 946 of the to-be-formed cavity structure. The one or more sidewalls 946 may connect the bottom 942 and the top 944 of the to-be-formed cavity structure.

Figure 9G:
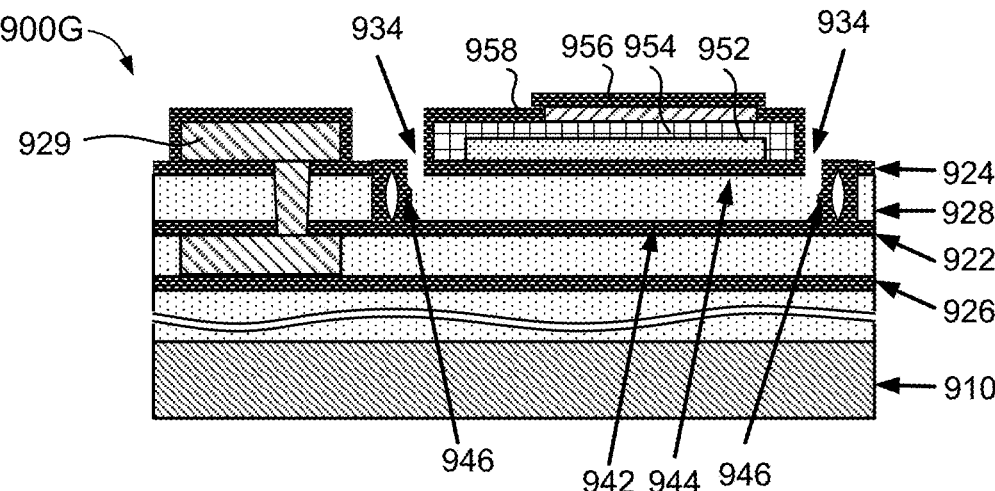

As shown in FIG. 9G, a semiconductor structure 900G is formed based on the semiconductor structure 900F by forming one or more openings 934 through at least the second etch stop layer 924. In some aspects, the one or more openings 934 are within an inner region defined by the one or more sidewalls 946. In some aspects, the forming the one or more openings 934 may be based on an anisotropic etching process.

Figure 9H:
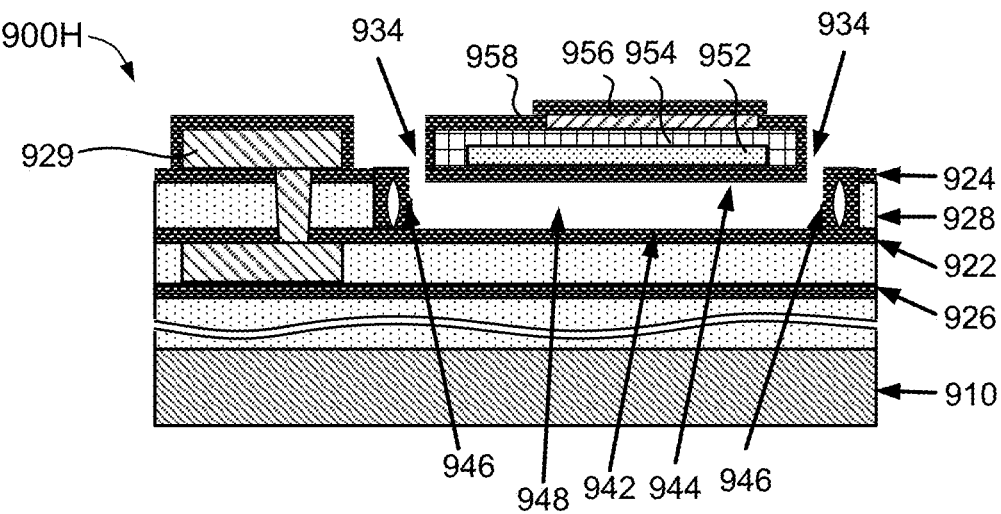

As shown in FIG. 9H, a semiconductor structure 900H is formed based on the semiconductor structure 900F by performing an etching process based on moving an etchant through the one or more openings 934 to remove a portion of the second ILD layer 928 that is within a region defined by the bottom 942, the top 944, and the one or more sidewalls 946. In some aspects, the etchant may include dilute hydrogen fluoride (HF). In some aspects, the etching process may be an isotropic etching process. In some aspects, as a result of the removal of the portion of the second ILD layer 928, the cavity 948 of the to-be-formed cavity structure is formed. In some aspects, the cavity 948 may be filled with air.

Figure 9I:
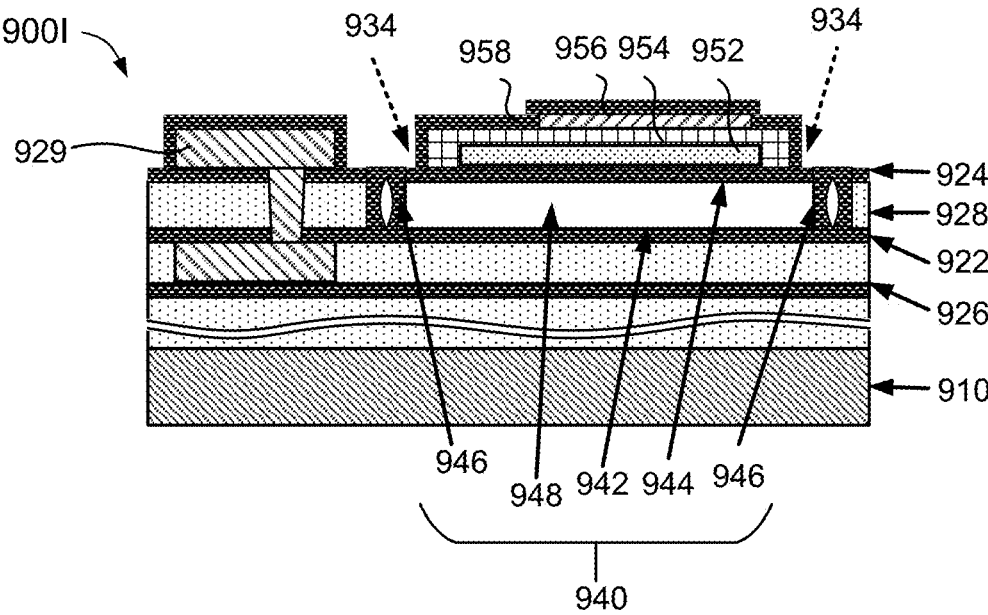

As shown in FIG. 9I, a semiconductor structure 900I is formed based on the semiconductor structure 900H by performing a etch stop material (e.g., SiN) deposition to seal the one or more openings 934. After the one or more openings 934 are sealed, the cavity structure 940 is completed.

Figures 9J, 9K:
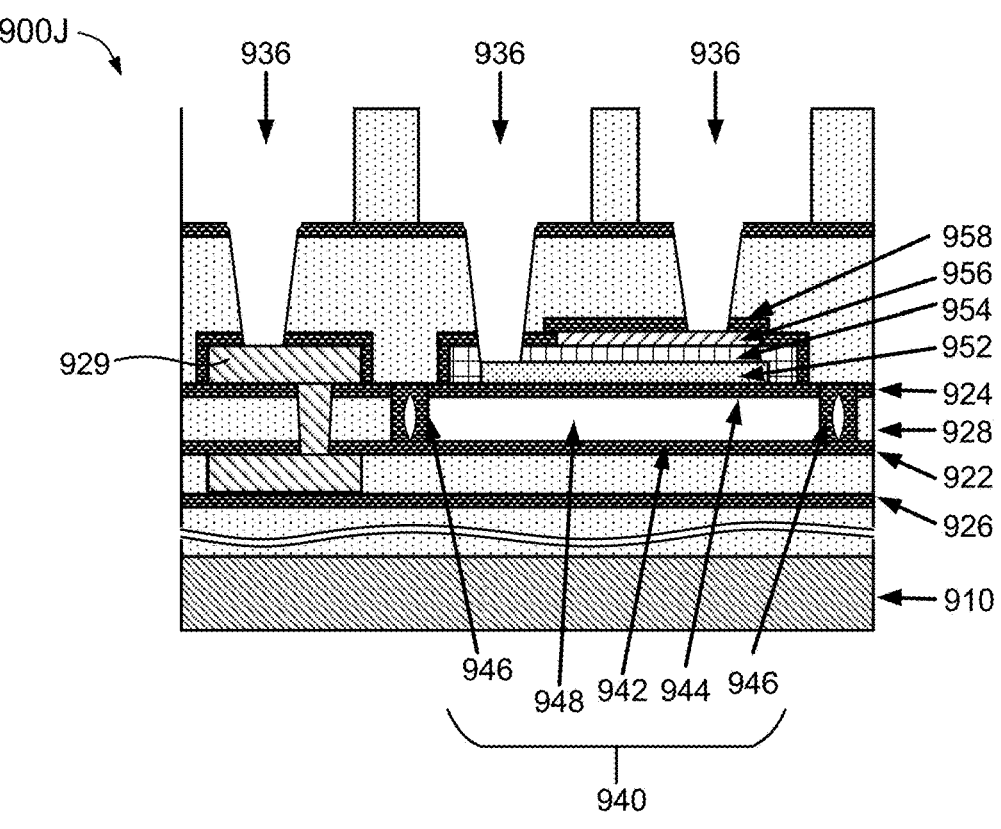

As shown in FIG. 9J, a semiconductor structure 900J is formed based on the semiconductor structure 900I by forming one or more ILD layers and/or one or more etch stop layers above the semiconductor structure 900I, and forming one or more openings 936 through the one or more ILD layers and/or one or more etch stop layers above the semiconductor structure 900I. The one or more openings may expose the interconnection structure 929 as well as the lower conductive structure 952, the piezoelectric layer 954, and/or the upper conductive structure 956 based on the design of the resonator.

As shown in FIG. 9K, a semiconductor structure 900K is formed based on the semiconductor structure 900J by filling the one or more openings 936 with one or more conductive materials to form contact structures 962, 964, and 966. In some aspects, the one or more conductive materials may include copper, aluminum, or any combination thereof.

In this example, the semiconductor structure 900K may correspond to the semiconductor structure 400B shown in FIG. 4B. For example, the cavity structure 940, the lower conductive structure 952, the piezoelectric layer 954, the upper conductive structure 956, the contact structure 962, and the contact structure 964 may respectively correspond to the cavity structure 440, the lower conductive structure 452, the piezoelectric layer 454, the upper conductive structure 456, the contact structure 462, and the contact structure 464 in FIG. 4B.

In some examples, to form a semiconductor structure similar to the semiconductor structure 400D shown in FIG. 4D, the intermediate etch stop layer 443 and a dielectric layer 447 between the top 444 of the cavity structure 440 may be formed at the stage of forming the semiconductor structure 900A. In some aspects, the second ILD layer 928 may be partially etched, the intermediate etch stop layer 443 may be deposited, the dielectric layer 447 may be deposited and patterned on the intermediate etch stop layer 443, and the second etch stop layer 924 may be formed over the intermediate etch stop layer 443 may be deposited, the dielectric layer 447.

In some aspects, the intermediate etch stop layer 443, the dielectric layer 447, and/or the second etch stop layer 924 may be formed based on a feedforward deposition method for controlling the thicknesses thereof to allow for better frequency tunability and temperature compensation, to allow tighter processing by inline tracking of the deposited thicknesses and on-the-fly adjustment for the other incoming wafers. For example, the thickness of the piezoelectric layer 954 of a current wafer may be measured for the purpose of adjusting the deposition parameters for forming the intermediate etch stop layer 443, the dielectric layer 447, and/or the second etch stop layer 924 of a next wafer.

In some examples, to form a semiconductor structure based on the semiconductor structure 600A shown in FIG. 6A or the semiconductor structure 800A shown in FIG. 8A, the process corresponding to FIG. 9B may be omitted, and the processes corresponding to FIG. 9J may be modified to provide the desirable location of the contact structures.

Figures 9L, 9M:
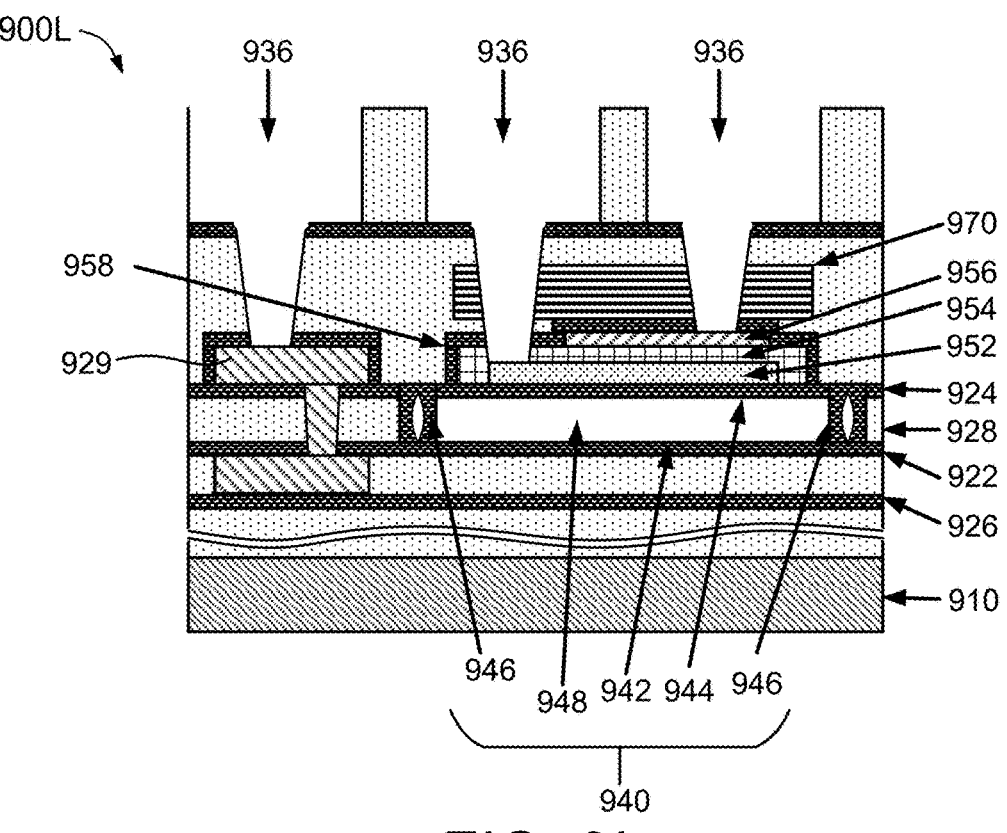
FIGS. 9L-9M, together with FIGS. 9A-9I, illustrate an example partial method for manufacturing a semiconductor structure, according to aspects of the disclosure.

FIGS. 9L-9M, together with FIGS. 9A-9I, illustrate an example partial method for manufacturing a semiconductor structure (such as the semiconductor structure 400C in FIG. 4C), according to aspects of the disclosure. An IC (e.g., the IC chip 300) may include one or more transistors on a substrate and an interconnection structure on the one or more transistors. In some aspects, the interconnection structure may include a plurality of interconnection layers, a plurality of interlayer dielectric layers, and a semiconductor structure (such as the semiconductor structure 400C or the semiconductor structure 900M) embedded in the interconnection structure.

As shown in FIG. 9L, a semiconductor structure 900L is formed based on the semiconductor structure 900I by forming an acoustic reflecting structure 970 over the upper conductive structure 956 and over the etch stop layer 958, forming one or more ILD layers and/or one or more etch stop layers above the semiconductor structure 900I, and forming one or more openings 936 through the acoustic reflecting structure 970, the one or more ILD layers, and/or one or more etch stop layers above the semiconductor structure 900I. The one or more openings may expose the interconnection structure 929 as well as the lower conductive structure 952, the piezoelectric layer 954, and/or the upper conductive structure 956 based on the design of the resonator.

In some aspects, the acoustic reflecting structure 970 may be formed by depositing layers of refractory materials, and the refractory materials may include tungsten, titanium, tantalum oxide, or any combination thereof. In some aspects, the acoustic reflecting structure 970 may be a Bragg reflector.

As shown in FIG. 9M, a semiconductor structure 900M is formed based on the semiconductor structure 900L by filling one or more openings 936 with one or more conductive materials to form contact structures 962, 964, and 966. In some aspects, the one or more conductive materials may include copper, aluminum, or any combination thereof.

In this example, the semiconductor structure 900M may correspond to the semiconductor structure 400C shown in FIG. 4C. For example, the cavity structure 940, the lower conductive structure 952, the piezoelectric layer 954, the upper conductive structure 956, the contact structure 962, and the contact structure 964 may respectively correspond to the cavity structure 440, the lower conductive structure 452, the piezoelectric layer 454, the upper conductive structure 456, the contact structure 462, and the contact structure 464 in FIG. 4C. also, the acoustic reflecting structure 970 may correspond to acoustic reflecting structure 470 in FIG. 4C.

FIG. 10 illustrates a method 1000 for manufacturing an IC that includes a semiconductor structure (such as the semiconductor structure 400B or 400C and their variations), according to aspects of the disclosure.

At operation 1002, one or more transistors are formed on a substrate.

At operation 1006, an interconnection structure is formed on the one or more transistors. In some aspects, the interconnection structure may include a plurality of interconnection layers, a plurality of interlayer dielectric layers, and a semiconductor structure embedded in the interconnection structure. Operation 1006 may further include at least operations 1010-1040 for forming the interconnection structure.

At operation 1010, a piezoelectric layer (e.g., the piezoelectric layer 454) is formed over a first etch stop layer (e.g., the first etch stop layer 342) and a second etch stop layer (e.g., the second etch stop layer 344), the first etch stop layer being over a substrate (e.g., the substrate 302, as part of the FEOL portion 410), and the second etch stop layer being over the first etch stop layer.

At operation 1020, an upper conductive structure (e.g., the upper conductive structure 456) is formed on the piezoelectric layer. In some aspects, the piezoelectric layer may include aluminum nitride, aluminum scandium nitride, or any combination thereof.

At operation 1030, a cavity structure (e.g., the cavity structure 440) is formed after the upper conductive structure is formed. In some aspects, the cavity structure may include a bottom (e.g., the bottom 442) that is a part of the first etch stop layer, a top (e.g., the top 444) that is a part of the second etch stop layer, one or more sidewalls (e.g., the one or more sidewalls 446) connecting the bottom and the top of the cavity structure, and a cavity (e.g., the cavity 448) between the top and the bottom of the cavity structure and surrounded by the one or more sidewalls. In some aspects, the cavity may be filled with air.

In some aspects, the cavity structure may be formed based on forming one or more first openings through the second etch stop layer and an interlayer dielectric layer (e.g., the first ILD layer 352) between the first etch stop layer and the second etch stop layer, and the one or more first openings may expose a portion of the first etch stop layer. Afterwards, the one or more first openings are at least partially filled with an etch stop material to form the one or more sidewalls. One or more second openings through the second etch stop layer may be formed, where the one or more second openings are within an inner region defined by the one or more sidewalls. An etching process may be performed based on moving an etchant through the one or more second openings to remove a portion of the interlayer dielectric layer that is within a region defined by the bottom, the top, and the one or more sidewalls. In some aspects, the forming the one or more second openings may be based on an anisotropic etching process.

Afterwards, for forming the cavity structure, the one or more second openings may be sealed with an etch stop material. In some aspects, a third etch stop layer (e.g., 428) may be over the upper conductive structure together with forming the one or more sidewalls based on a same deposition process. In some aspects, the first etch stop layer, the second etch stop layer, the third etch stop layer, and the etch stop material may include silicon nitride.

At operation 1040, a first contact structure (e.g., the first contact structure 462) is formed on the upper conductive structure. In some aspects, at operation 1040, a second contact structure (e.g., the second contact structure 464) may also be formed on the upper conductive structure.

In some aspects, prior to the operation 1010, a lower conductive layer may be formed on the second etch stop layer, such that the lower conductive structure is between the piezoelectric layer and the top of the cavity structure.

In some aspects, prior to the operation 1040, an acoustic reflecting structure (e.g., the acoustic reflecting structure 470) may be formed over the upper conductive structure. In some aspects, the acoustic reflecting structure includes layers of refractory materials, and the refractory materials include tungsten, titanium, tantalum oxide, or any combination thereof.

In some aspects, prior to the operation 1040 or concurrent with the operations 1010 and 1020, an MIM capacitor or an MOM capacitor may be formed on an interlayer dielectric layer (e.g., the first ILD layer 352), and the interlayer dielectric layer is on the first etch stop layer. In some aspects, the MIM capacitor or the MOM capacitor may be formed in another interlayer dielectric layer (e.g., the second ILD layer 354), and the another interlayer dielectric layer is on the second etch stop layer.

In some aspects, based on the designs as shown in FIGS. 5A, 5C, and 5D, the forming the lower conductive structure may include patterning a lower conductive layer to become the lower conductive structure that includes a lower pattern portion aligned over the cavity, and a lower anchor portion coupled to the lower pattern portion. In some aspects, the forming the upper conductive structure may include patterning an upper conductive layer to become the upper conductive structure that includes an upper pattern portion aligned over the cavity and at least partially overlapping the lower pattern portion, and an upper anchor portion coupled to the upper pattern portion. In some aspects, the lower pattern portion may have a lower patch pattern or a lower finger pattern, and the upper pattern portion may have an upper patch pattern or an upper finger pattern. In some aspects, the first contact structure may be coupled to the upper anchor portion. In some aspects, the second contact structure may be coupled to the lower anchor portion.

In some aspects, based on the design as shown in FIG. 5B, the forming the lower conductive structure may include patterning a lower conductive layer to become the lower conductive structure that includes a lower finger portion aligned over the cavity, and a lower anchor portion coupled to the lower finger portion. In some aspects, the forming the upper conductive structure may include patterning an upper conductive layer to become the upper conductive structure that includes an upper finger portion aligned over the cavity without overlapping the lower finger portion, and an upper anchor portion coupled to the upper finger portion. In some aspects, the first contact structure may be coupled to the upper anchor portion. In some aspects, the second contact structure may be coupled to the lower anchor portion.

In some aspects, based on the designs as shown in FIGS. 6B and 6C, the forming the upper conductive structure may include patterning an upper conductive layer to become the upper conductive structure that includes an upper pattern portion aligned over the cavity and at least partially overlapping the upper pattern portion, and an upper anchor portion coupled to the upper pattern portion. In some aspects, the upper pattern portion may have an upper patch pattern or an upper finger pattern. In some aspects, the first contact structure may be coupled to the upper anchor portion. In some aspects, the second contact structure may be coupled to the piezoelectric platelayer.

In some aspects, based on the design as shown in FIG. 8B, the forming the upper conductive structure may include patterning an upper conductive layer to become the upper conductive structure that includes a first upper pattern portion aligned over the cavity, a first upper anchor portion coupled to the first upper pattern portion, a second upper pattern portion aligned over the cavity without overlapping the first upper pattern portion, and a second upper anchor portion coupled to the second upper pattern portion. In some aspects, the first contact structure may be coupled to the first upper anchor portion. In some aspects, the second contact structure may be coupled to the second upper anchor portion.

In some aspects, based on the designs as shown in FIGS. 8C and 8D, the forming the upper conductive structure may include patterning an upper conductive layer to become the upper conductive structure that includes a vibration pattern aligned over the cavity and aligned over the piezoelectric platelayer, and multiple input/output terminals capacitively coupled with the vibration pattern. In some aspects, the semiconductor structure may include multiple contact structures (including the first contact structure and/or the second contact structure) that are coupled to the multiple input/output terminals, respectively.

As will be appreciated, a technical advantage of the method 1000 is to form a monolithic-integrated resonator that is based on an MIM/MOM manufacturing flow and compatible with a CMOS manufacturing process. Accordingly, the monolithic-integrated resonators as described in this disclosure may replace the relatively more expensive crystal resonators. Also, by integrating the resonator into the IC chip, the resulting design may have a smaller package, as simplified package process (e.g., based on regular CMOS packaging like flip chip packaging, CuP packaging, or QFN packaging, without extra bonding), with less parasitic effects (e.g., less degradation of the Q factor), and with less manufacturing costs.

Figure 11:
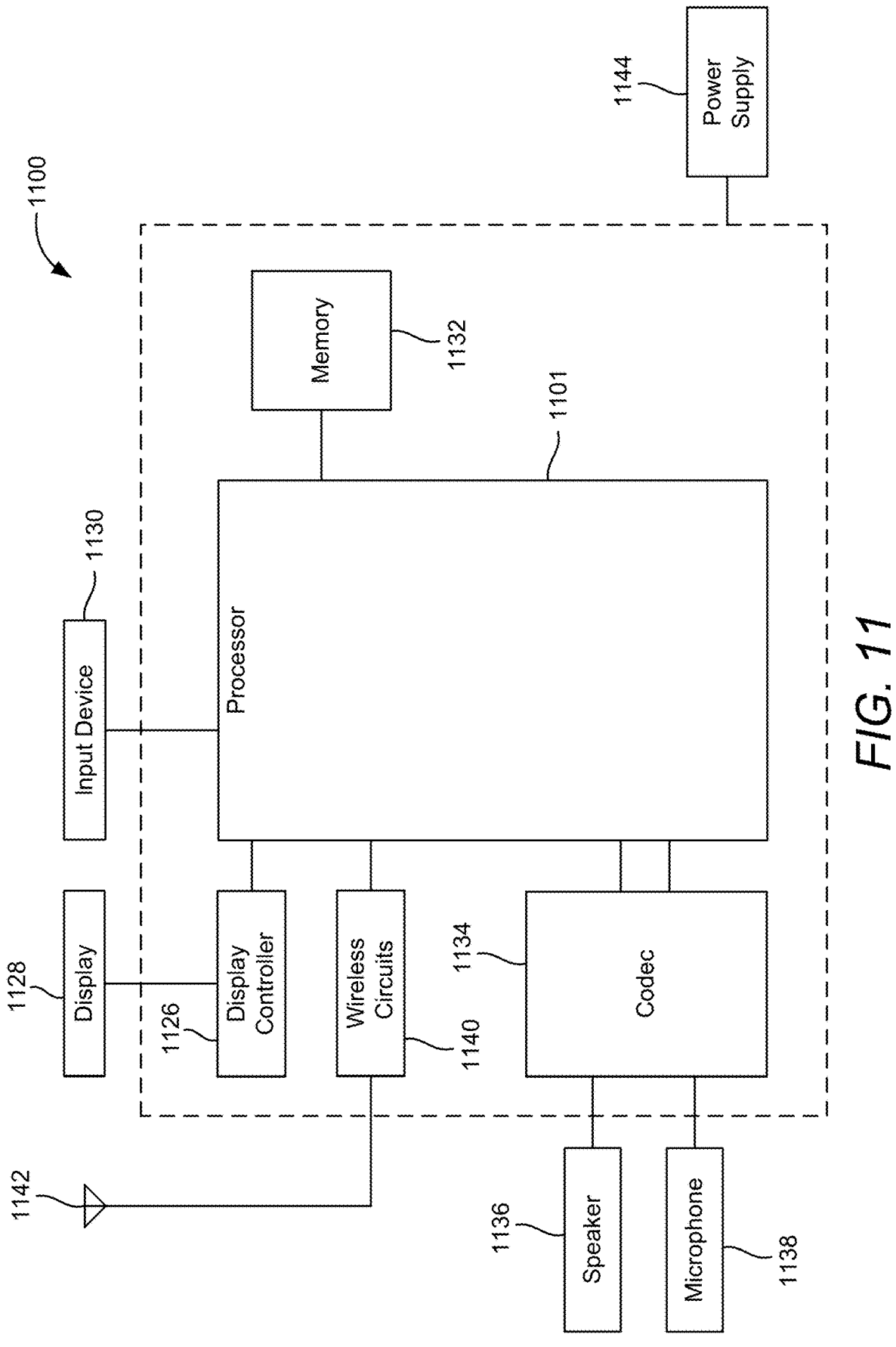
FIG. 11 illustrates a mobile device example, according to aspects of the disclosure.

FIG. 11 illustrates a mobile device 1100, according to aspects of the disclosure. In some aspects, the mobile device 1100 may be implemented by including one or more ICs including semiconductor structures manufactured based on the examples described in this disclosure.

In some aspects, mobile device 1100 may be configured as a wireless communication device. As shown, mobile device 1100 includes processor 1101. Processor 1101 may be communicatively coupled to memory 1132 over a link, which may be a die-to-die or chip-to-chip link. Mobile device 1100 also includes display 1128 and display controller 1126, with display controller 1126 coupled to processor 1101 and to display 1128. The mobile device 1100 may include input device 1130 (e.g., physical, or virtual keyboard), power supply 1144 (e.g., battery), speaker 1136, microphone 1138, and wireless antenna 1142. In some aspects, the power supply 1144 may directly or indirectly provide the supply voltage for operating some or all of the components of the mobile device 1100.

In some aspects, FIG. 11 may include coder/decoder (CODEC) 1134 (e.g., an audio and/or voice CODEC) coupled to processor 1101; speaker 1136 and microphone 1138 coupled to CODEC 1134; and wireless circuits 1140 (which may include a modem, RF circuitry, filters, etc.) coupled to wireless antenna 1142 and to processor 1101.

In some aspects, one or more of processor 1101, display controller 1126, memory 1132, CODEC 1134, and wireless circuits 1140 may include one or more ICs including semiconductor structures manufactured according to the examples described in this disclosure.

It should be noted that although FIG. 11 depicts a mobile device 1100, similar architecture may be used to implement an apparatus including a set top box, a music player, a video player, an entertainment unit, a navigation device, a personal digital assistant (PDA), a fixed location data unit, a computer, a laptop, a tablet, a communications device, a mobile phone, or other similar devices.

Figure 12:
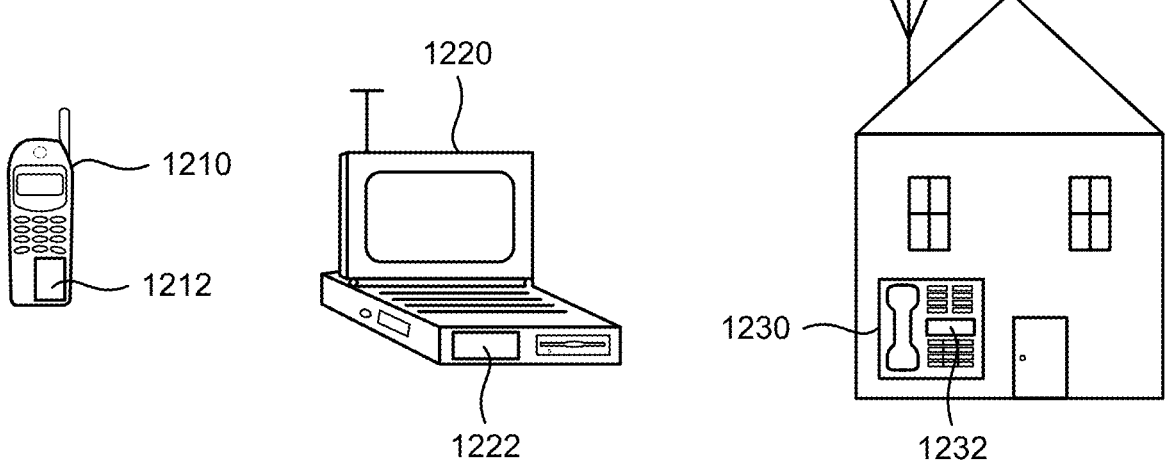
FIG. 12 illustrates various electronic devices that may be integrated with ICs, according to aspects of the disclosure.

FIG. 12 illustrates various electronic devices 1210, 1220, and 1230 that may be integrated with ICs 1212, 1222, and 1232, according to aspects of the disclosure. For example, a mobile phone device 1210, a laptop computer device 1220, and a fixed location terminal device 1230 may each be considered generally user equipment (UE) and may include one or more ICs, such as ICs 1212, 1222, and 1232, and a power supply to provide the supply voltages to power the ICs. The ICs 1212, 1222, and 1232 may be, for example, correspond to an IC including semiconductor structures manufactured based on the examples described above with reference to FIGS. 3-8E.

The devices 1210, 1220, and 1230 illustrated in FIG. 12 are merely non-limiting examples. Other electronic devices may also feature the Ics including semiconductor structures as described in this disclosure, including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device, a laptop computer, an access point, a base station or any other device that stores or retrieves data or computer instructions or any combination thereof.

It will be appreciated that various aspects disclosed herein can be described as functional equivalents to the structures, materials and/or devices described and/or recognized by those skilled in the art. For example, in one aspect, an apparatus may comprise a means for performing the various functionalities discussed above. It will be appreciated that the aforementioned aspects are merely provided as examples and the various aspects claimed are not limited to the specific references and/or illustrations cited as examples.

One or more of the components, processes, features, and/or functions illustrated in FIGS. 1-12 may be rearranged and/or combined into a single component, process, feature, or function or incorporated in several components, processes, or functions. Additional elements, components, processes, and/or functions may also be added without departing from the disclosure. In some implementations, FIGS. 1-12 and the corresponding description may be used to manufacture, create, provide, and/or produce integrated devices. In some implementations, a device may include a die, an integrated device, a die package, an IC, a device package, an IC package, a wafer, a semiconductor device, a system in package (SiP), a system on chip (SoC), a package on package (POP) device, and the like.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. Ues can be embodied by any of a number of types of devices including but not limited to printed circuit (PC) cards, compact flash devices, external or internal modems, wireless or wireline phones, smartphones, tablets, consumer tracking devices, asset tags, and so on.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart).

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer, or an electronic circuit. In some examples, some or a plurality of the most important method actions can be performed by such an apparatus.

In the detailed description above it can be seen that different features are grouped together in examples. This manner of disclosure should not be understood as an intention that the example clauses have more features than are explicitly mentioned in each clause. Rather, the various aspects of the disclosure may include fewer than all features of an individual example clause disclosed. Therefore, the following clauses should hereby be deemed to be incorporated in the description, wherein each clause by itself can stand as a separate example. Although each dependent clause can refer in the clauses to a specific combination with one of the other clauses, the aspect(s) of that dependent clause are not limited to the specific combination. It will be appreciated that other example clauses can also include a combination of the dependent clause aspect(s) with the subject matter of any other dependent clause or independent clause or a combination of any feature with other dependent and independent clauses. The various aspects disclosed herein expressly include these combinations, unless it is explicitly expressed or can be readily inferred that a specific combination is not intended (e.g., contradictory aspects, such as defining an element as both an electrical insulator and an electrical conductor). Furthermore, it is also intended that aspects of a clause can be included in any other independent clause, even if the clause is not directly dependent on the independent clause.

Implementation examples are described in the following numbered clauses:

Clause 1. An integrated circuit (IC), comprising: one or more transistors on a substrate; and an interconnection structure on the one or more transistors, the interconnection structure including a plurality of interconnection layers, a plurality of interlayer dielectric layers, and a semiconductor structure embedded in the interconnection structure, wherein the semiconductor structure comprises: a cavity structure that includes: a bottom that is a part of a first etch stop layer; a top that is a part of a second etch stop layer over the first etch stop layer; one or more sidewalls connecting the bottom and the top of the cavity structure; and a cavity between the top and the bottom of the cavity structure and surrounded by the one or more sidewalls; a piezoelectric layer over the cavity structure; an upper conductive structure on the piezo-electric layer; and a first contact structure on the upper conductive structure.

Clause 2. The IC of clause 1, further comprising: a lower conductive structure between the piezoelectric layer and the top of the cavity structure.

Clause 3. The IC of clause 2, wherein: the lower conductive structure includes: a lower pattern portion over the cavity; and a lower anchor portion coupled to the lower pattern portion, the upper conductive structure includes: an upper pattern portion over the cavity and at least partially overlapping the lower pattern portion; and an upper anchor portion coupled to the upper pattern portion, the lower pattern portion has a lower patch pattern or a lower finger pattern, the upper pattern portion has an upper patch pattern or an upper finger pattern, the first contact structure is coupled to the upper anchor portion, and the semiconductor structure further comprises a second contact structure that is coupled to the lower anchor portion.

Clause 4. The IC of clause 2, wherein: the lower conductive structure includes: a lower finger portion over the cavity; and a lower anchor portion coupled to the lower finger portion, the upper conductive structure includes: an upper finger portion over the cavity without overlapping the lower finger portion; and an upper anchor portion coupled to the upper finger portion, the first contact structure is coupled to the upper anchor portion, and the semiconductor structure further comprises a second contact structure that is coupled to the lower anchor portion.

Clause 5. The IC of any of clauses 1 to 4, wherein: the upper conductive structure includes: an upper pattern portion over the cavity; and an upper anchor portion coupled to the upper pattern portion, the upper pattern portion has an upper patch pattern or an upper finger pattern, and the first contact structure is coupled to the upper anchor portion.

Clause 6. The IC of clause 1, wherein: the upper conductive structure includes: a first upper pattern portion over the cavity; a first upper anchor portion coupled to the first upper pattern portion; a second upper pattern portion over the cavity without overlapping the first upper pattern portion; and a second upper anchor portion coupled to the second upper pattern portion, the first contact structure is coupled to the first upper anchor portion, and the semiconductor structure further comprises a second contact structure that is coupled to the second upper anchor portion.

Clause 7. The IC of clause 1, wherein: the upper conductive structure includes: a vibration pattern over the cavity; and multiple input/output terminals capacitively coupled with the vibration pattern, the semiconductor structure comprises multiple contact structures that include the first contact structure, and the multiple contact structures are coupled to the multiple input/output terminals, respectively.

Clause 8. The IC of any of clauses 1 to 7, further comprising: an acoustic reflecting structure over the upper conductive structure.

Clause 9. The IC of clause 8, wherein the acoustic reflecting structure includes layers of refractory materials, and the refractory materials include tungsten, titanium, tantalum oxide, or any combination thereof.

Clause 10. The IC of any of clauses 1 to 9, wherein the piezoelectric layer includes aluminum nitride, aluminum scandium nitride, or any combination thereof.

Clause 11. The IC of any of clauses 1 to 10, wherein the top, the bottom, and the one or more sidewalls of the cavity structure include silicon nitride.

Clause 12. The IC of any of clauses 1 to 11, wherein the cavity structure further comprises: an intermediate etch stop layer; and a dielectric layer between the top of the cavity structure and the intermediate etch stop layer, wherein the cavity is between the intermediate etch stop layer and the bottom of the cavity structure.

Clause 13. The IC of any of clauses 1 to 12, wherein the interconnection structure further comprises a metal-insulator-metal (MIM) capacitor or a metal-oxide-metal (MOM) capacitor in one of the plurality of interlayer dielectric layers, wherein the one of the plurality of interlayer dielectric layers is on the second etch stop layer.

Clause 14. A method of manufacturing an integrated circuit (IC), comprising: forming one or more transistors on a substrate; and forming an interconnection structure on the one or more transistors, the interconnection structure including a plurality of interconnection layers, a plurality of interlayer dielectric layers, and a semiconductor structure embedded in the interconnection structure, the forming the interconnection structure comprising: forming a piezoelectric layer over a first etch stop layer and a second etch stop layer, the first etch stop layer being over the substrate, and the second etch stop layer being over the first etch stop layer; forming an upper conductive structure on the piezoelectric layer; forming a cavity structure after the upper conductive structure is formed, the cavity structure including: a bottom that is a part of the first etch stop layer; a top that is a part of the second etch stop layer; one or more sidewalls connecting the bottom and the top of the cavity structure; and a cavity between the top and the bottom of the cavity structure and surrounded by the one or more sidewalls; and forming a first contact structure on the upper conductive structure.

Clause 15. The method of clause 14, wherein the piezoelectric layer includes aluminum nitride, aluminum scandium nitride, or any combination thereof.

Clause 16. The method of any of clauses 14 to 15, wherein the forming the interconnection structure further comprises: forming an acoustic reflecting structure over the upper conductive structure.

Clause 17. The method of clause 16, wherein the acoustic reflecting structure includes layers of refractory materials, and the refractory materials include tungsten, titanium, tantalum oxide, or any combination thereof.

Clause 18. The method of any of clauses 14 to 17, wherein the forming the interconnection structure further comprises forming a metal-insulator-metal (MIM) capacitor or a metal-oxide-metal (MOM) capacitor in one of the plurality of interlayer dielectric layers, wherein the one of the plurality of interlayer dielectric layers is on the second etch stop layer.

Clause 19. The method of any of clauses 14 to 18, wherein the forming the cavity structure comprises: forming one or more first openings through the second etch stop layer and an interlayer dielectric layer between the first etch stop layer and the second etch stop layer, the one or more first openings exposing a portion of the first etch stop layer; forming a third etch stop layer over the upper conductive structure; at least partially filling the one or more first openings with an etch stop material to form the one or more sidewalls; forming one or more second openings through the second etch stop layer, the one or more second openings being within an inner region defined by the one or more sidewalls; and performing an etching process based on moving an etchant through the one or more second openings to remove a portion of the interlayer dielectric layer that is within a region defined by the bottom, the top, and the one or more sidewalls.

Clause 20. The method of clause 19, wherein the forming the cavity structure further comprises: sealing the one or more second openings with the etch stop material.

Clause 21. The method of any of clauses 19 to 20, wherein the forming the third etch stop layer and the at least partially filling the one or more first openings are based on a same deposition process.

Clause 22. The method of any of clauses 19 to 21, wherein the forming the one or more second openings is based on an anisotropic etching process.

Clause 23. The method of any of clauses 14 to 22, further comprising: forming a lower conductive structure between the piezoelectric layer and the top of the cavity structure.

Clause 24. The method of clause 23, wherein: the forming the lower conductive structure includes patterning a lower conductive layer to become the lower conductive structure that includes: a lower pattern portion over the cavity; and a lower anchor portion coupled to the lower pattern portion, the forming the upper conductive structure includes patterning an upper conductive layer to become the upper conductive structure that includes: an upper pattern portion over the cavity and at least partially overlapping the lower pattern portion; and an upper anchor portion coupled to the upper pattern portion, the lower pattern portion has a lower patch pattern or a lower finger pattern, the upper pattern portion has an upper patch pattern or an upper finger pattern, the first contact structure is coupled to the upper anchor portion, and the method further comprises forming a second contact structure that is coupled to the lower anchor portion.

Clause 25. The method of clause 23, wherein: the forming the lower conductive structure includes patterning a lower conductive layer to become the lower conductive structure that includes: a lower finger portion over the cavity; and a lower anchor portion coupled to the lower finger portion, the forming the upper conductive structure includes patterning an upper conductive layer to become the upper conductive structure that includes: an upper finger portion over the cavity without overlapping the lower finger portion; and an upper anchor portion coupled to the upper finger portion, the first contact structure is coupled to the upper anchor portion, and the method further comprises forming a second contact structure that is coupled to the lower anchor portion.

Clause 26. The method of any of clauses 14 to 25, wherein: the forming the upper conductive structure includes patterning an upper conductive layer to become the upper conductive structure that includes: an upper pattern portion over the cavity; and an upper anchor portion coupled to the upper pattern portion, the upper pattern portion has an upper patch pattern or an upper finger pattern, and the first contact structure is coupled to the upper anchor portion.

Clause 27. The method of any of clauses 14 to 22, wherein: the forming the upper conductive structure includes patterning an upper conductive layer to become the upper conductive structure that includes: a first upper pattern portion over the cavity; a first upper anchor portion coupled to the first upper pattern portion; a second upper pattern portion over the cavity without overlapping the first upper pattern portion; and a second upper anchor portion coupled to the second upper pattern portion, the first contact structure is coupled to the first upper anchor portion, and the method further comprises forming a second contact structure that is coupled to the second upper anchor portion.

Clause 28. The method of any of clauses 14 to 22, wherein: the forming the upper conductive structure includes patterning an upper conductive layer to become the upper conductive structure that includes: a vibration pattern over the cavity; and multiple input/output terminals capacitively coupled with the vibration pattern, the method further comprises forming multiple contact structures that include the first contact structure, and the multiple contact structures are coupled to the multiple input/output terminals, respectively.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a general purpose processor, a DSP, an ASIC, an FPGA, or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods, sequences and/or algorithms described in connection with the aspects disclosed herein may be embodied directly in hardware, in a software module executed by a processor, or in a combination of the two. A software module may reside in random access memory (RAM), flash memory, read-only memory (ROM), erasable programmable ROM (EPROM), electrically erasable programmable ROM (EEPROM), registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor. The processor and the storage medium may reside in an ASIC. The ASIC may reside in a user terminal (e.g., UE). In the alternative, the processor and the storage medium may reside as discrete components in a user terminal.

In one or more example aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

While the foregoing disclosure shows illustrative aspects of the disclosure, it should be noted that various changes and modifications could be made herein without departing from the scope of the disclosure as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

What is claimed is:

1. An integrated circuit (IC), comprising:
one or more transistors on a substrate; and
an interconnection structure on the one or more transistors, the interconnection structure including a plurality of interconnection layers, a plurality of interlayer dielectric layers, and a semiconductor structure embedded in the interconnection structure,
wherein the semiconductor structure comprises:
a cavity structure that includes:
a bottom that is a part of a first etch stop layer;
a top that is a part of a second etch stop layer over the first etch stop layer;
one or more sidewalls connecting the bottom and the top of the cavity structure; and
a cavity between the top and the bottom of the cavity structure and surrounded by the one or more sidewalls;
a piezoelectric layer over the cavity structure;
an upper conductive structure on the piezoelectric layer; and
a first contact structure on the upper conductive structure; and
wherein:
the upper conductive structure includes:
a first upper pattern portion over the cavity;
a first upper anchor portion coupled to the first upper pattern portion;
a vibration pattern over the cavity; and
multiple input/output terminals capacitively coupled with the vibration pattern,
the first upper pattern portion has an upper patch pattern or an upper finger pattern, the first contact structure is coupled to the first upper anchor portion,
the semiconductor structure comprises multiple contact structures that include the first contact structure, and
the multiple contact structures are coupled to the multiple input/output terminals, respectively.

2. The IC of claim 1, further comprising:
an acoustic reflecting structure over the upper conductive structure.

3. The IC of claim 2, wherein the acoustic reflecting structure includes layers of refractory materials, and the refractory materials include tungsten, titanium, tantalum oxide, or any combination thereof.

4. The IC of claim 1, wherein:
the upper conductive structure further includes:
a second upper pattern portion over the cavity without overlapping the first upper pattern portion; and
a second upper anchor portion coupled to the second upper pattern portion, and
the semiconductor structure further comprises a second contact structure that is coupled to the second upper anchor portion.

5. The IC of claim 1, wherein the piezoelectric layer includes aluminum nitride, aluminum scandium nitride, or any combination thereof.

6. The IC of claim 1, wherein the top, the bottom, and the one or more sidewalls of the cavity structure include silicon nitride.

7. The IC of claim 1, wherein the cavity structure further comprises:
an intermediate etch stop layer; and
a dielectric layer between the top of the cavity structure and the intermediate etch stop layer,
wherein the cavity is between the intermediate etch stop layer and the bottom of the cavity structure.

8. The IC of claim 1, wherein the interconnection structure further comprises a metal-insulator-metal (MIM) capacitor or a metal-oxide-metal (MOM) capacitor in one of the plurality of interlayer dielectric layers, wherein the one of the plurality of interlayer dielectric layers is on the second etch stop layer.

9. A method of manufacturing an integrated circuit (IC), comprising:
forming one or more transistors on a substrate; and
forming an interconnection structure on the one or more transistors, the interconnection structure including a plurality of interconnection layers, a plurality of interlayer dielectric layers, and a semiconductor structure embedded in the interconnection structure, the forming the interconnection structure comprising:
forming a piezoelectric layer over a first etch stop layer and a second etch stop layer, the first etch stop layer being over the substrate, and the second etch stop layer being over the first etch stop layer;
forming an upper conductive structure on the piezoelectric layer;
forming a cavity structure after the upper conductive structure is formed, the cavity structure including:
a bottom that is a part of the first etch stop layer;
a top that is a part of the second etch stop layer;
one or more sidewalls connecting the bottom and the top of the cavity structure; and
a cavity between the top and the bottom of the cavity structure and surrounded by the one or more sidewalls; and
forming a first contact structure on the upper conductive structure, wherein:

the forming the upper conductive structure includes patterning an upper conductive layer to become the upper conductive structure that includes:
    a first upper pattern portion over the cavity;
    a first upper anchor portion coupled to the first upper pattern portion;
    a vibration pattern over the cavity; and
    multiple input/output terminals capacitively coupled with the vibration pattern,
the first upper pattern portion has an upper patch pattern or an upper finger pattern,
the first contact structure is coupled to the first upper anchor portion,
the semiconductor structure comprises multiple contact structures that include the first contact structure, and
the multiple contact structures are coupled to the multiple input/output terminals, respectively.

10. The method of claim 9, wherein the forming the cavity structure comprises:
    forming one or more first openings through the second etch stop layer and an interlayer dielectric layer between the first etch stop layer and the second etch stop layer, the one or more first openings exposing a portion of the first etch stop layer;
    forming a third etch stop layer over the upper conductive structure;
    at least partially filling the one or more first openings with an etch stop material to form the one or more sidewalls;
    forming one or more second openings through the second etch stop layer, the one or more second openings being within an inner region defined by the one or more sidewalls; and
    performing an etching process based on moving an etchant through the one or more second openings to remove a portion of the interlayer dielectric layer that is within a region defined by the bottom, the top, and the one or more sidewalls.

11. The method of claim 10, wherein the forming the cavity structure further comprises:

sealing the one or more second openings with the etch stop material.

12. The method of claim 10, wherein the forming the third etch stop layer and the at least partially filling the one or more first openings are based on a same deposition process.

13. The method of claim 10, wherein the forming the one or more second openings is based on an anisotropic etching process.

14. The method of claim 9, wherein the forming the interconnection structure further comprises: forming an acoustic reflecting structure over the upper conductive structure.

15. The method of claim 14, wherein the acoustic reflecting structure includes layers of refractory materials, and the refractory materials include tungsten, titanium, tantalum oxide, or any combination thereof.

16. The method of claim 9, wherein the piezoelectric layer includes aluminum nitride, aluminum scandium nitride, or any combination thereof.

17. The method of claim 9, wherein the forming the interconnection structure further comprises forming a metal-insulator-metal (MIM) capacitor or a metal-oxide-metal (MOM) capacitor in one of the plurality of interlayer dielectric layers, wherein the one of the plurality of interlayer dielectric layers is on the second etch stop layer.

18. The method of claim 9, wherein:
    the forming the upper conductive structure includes the patterning the upper conductive layer to become the upper conductive structure that further includes:
        a second upper pattern portion over the cavity without overlapping the first upper pattern portion; and
        a second upper anchor portion coupled to the second upper pattern portion, and
    the method further comprises forming a second contact structure that is coupled to the second upper anchor portion.

* * * * *